(12) United States Patent
Yu et al.

(10) Patent No.: US 11,808,979 B2
(45) Date of Patent: Nov. 7, 2023

(54) DEVICE COUPON AND METHOD OF FABRICATION THEREOF

(71) Applicant: ROCKLEY PHOTONICS LIMITED, Altrincham (GB)

(72) Inventors: Guomin Yu, Glendora, CA (US); Aaron John Zilkie, Pasadena, CA (US)

(73) Assignee: Rockley Photonics Limited, Altrincham (GB)

( * ) Notice: Subject to any disclaimer, the term of this patent is extended or adjusted under 35 U.S.C. 154(b) by 22 days.

(21) Appl. No.: 17/203,274

(22) Filed: Mar. 16, 2021

(65) Prior Publication Data

US 2021/0311256 A1  Oct. 7, 2021

Related U.S. Application Data

(60) Provisional application No. 62/990,779, filed on Mar. 17, 2020.

(30) Foreign Application Priority Data

Dec. 15, 2020  (GB) ...................................... 2019776

(51) Int. Cl.
*G02B 6/10* (2006.01)
*G02B 6/136* (2006.01)
(Continued)

(52) U.S. Cl.
CPC .......... *G02B 6/136* (2013.01); *B41F 16/0046* (2013.01); *G02B 6/12* (2013.01);
(Continued)

(58) Field of Classification Search
CPC .......... G02B 6/136; G02B 6/12; G02B 6/122; G02B 6/00; G02B 6/42; G02B 6/43;
(Continued)

(56) References Cited

U.S. PATENT DOCUMENTS

2014/0334768 A1  11/2014  Chang et al.
2016/0327759 A1  11/2016  Keyvaninia et al.
(Continued)

OTHER PUBLICATIONS

"Transfer-printing based integration of III-V on silicon distributed feedback laser" by Zhang et al., Optics Express Apr. 2018 (Year: 2018).*

(Continued)

*Primary Examiner* — Kaveh C Kianni
*Assistant Examiner* — Hung Q Lam
(74) *Attorney, Agent, or Firm* — Lewis Roca Rothgerber Christie LLP

(57) ABSTRACT

A method of fabricating a device coupon including a waveguide which is suitable for use in a micro-transfer printing process. The method comprises the steps, on a wafer, of: depositing a lower cladding layer on an uppermost surface of the wafer; providing a silicon nitride guiding layer on an uppermost surface of the lower cladding; depositing an upper cladding over at least an uppermost surface of the silicon nitride guiding layer; providing a tether over the coupon, and etching away a region of the uppermost layer of the wafer located between the lower cladding layer and a substrate of the wafer, thereby leaving the lower cladding layer, silicon nitride guiding layer, and upper cladding layer suspended above the wafer via the tether.

28 Claims, 23 Drawing Sheets

(51) Int. Cl.
  *G02B 6/122* (2006.01)
  *G02B 6/12* (2006.01)
  *B41F 16/00* (2006.01)
  *G02B 6/132* (2006.01)
  *G02B 6/42* (2006.01)
  *G02B 6/43* (2006.01)
  *H01L 21/56* (2006.01)
  *H01L 23/00* (2006.01)

(52) U.S. Cl.
  CPC ............. *G02B 6/122* (2013.01); *G02B 6/132* (2013.01); *G02B 6/4207* (2013.01); *G02B 6/43* (2013.01); *H01L 21/561* (2013.01); *H01L 24/97* (2013.01); *H01L 2224/95001* (2013.01)

(58) Field of Classification Search
  CPC ....... G02B 6/13; H01L 21/7806; H01L 25/00; H01L 33/0095; H01L 33/0093; H01L 2221/68318; H01L 2221/6835; H01L 2221/68354; H01L 2221/68368; H01L 2221/68381; H01L 21/6835; H01L 21/78; H01L 31/12; H01L 21/8252
  USPC .............................. 385/14, 50, 52, 130–132
  See application file for complete search history.

(56) References Cited

U.S. PATENT DOCUMENTS

2019/0305179 A1   10/2019  Roelkens
2021/0066537 A1*   3/2021  Yu ............................ G02B 6/12

OTHER PUBLICATIONS

Katsumi, R. et al., "Transfer-printed single-photon sources coupled to wire waveguides", Optica, May 25, 2018, pp. 691-694, vol. 5, No. 6, Optical Society of America.
McPhillimy, J. et al., "High accuracy transfer printing of single-mode membrane silicon photonic devices", Optics Express, Jun. 14, 2018, p. 16679-16688, vol. 26, No. 13, The Optical Society.
Ye, N. et al., "High-alignment-accuracy transfer printing of passive silicon waveguide structures", Optics Express, Jan. 18, 2018, pp. 2023-2032, vol. 26, No. 2, Optical Society of America.
U.K. Intellectual Property Office Search and Examination Report, dated Aug. 24, 2021, for Patent Application No. GB2103619.9, 6 pages.

* cited by examiner

DEVICE COUPON AND METHOD OF FABRICATION THEREOF

RELATED APPLICATIONS

The present application (i) claims priority to and the benefit of U.S. Provisional Application No. 62/990,779, filed Mar. 17, 2020, entitled "METHOD AND DEVICE COUPON", and (ii) claims priority to and the benefit of United Kingdom Application No. GB 2019776.0, filed Dec. 15, 2020, entitled "COUPON WAFER AND METHOD OF PREPARATION THEREOF", the entire contents of both of which are incorporated herein by reference.

FIELD OF THE INVENTIONS

The present invention relates to a method of fabricating a device coupon, a device coupon, a method of manufacturing an optoelectronic device, and an optoelectronic device.

BACKGROUND

As compared to purely silicon waveguide, silicon nitride waveguides have several advantages. For example, silicon nitride waveguides typically demonstrate lower optical losses and are less sensitive to temperature. It would be advantageous then to integrate silicon nitride waveguides in silicon-on-insulator (SOI) platforms.

The conventional approach to integration of silicon nitride waveguides with SOI platforms is to deposit silicon oxide claddings and silicon nitride core layers in a SOI cavity. For example via plasma enhanced chemical vapour deposition. The structure is then planarized, for example via chemical-mechanical planarization, and then etched back. The resulting structures suffer from uniformity issues due to these processes, and so to a lower yield.

It would be advantageous to integrated silicon nitride waveguides into SOI platforms whilst overcoming these issues.

SUMMARY

Accordingly, in a first aspect, embodiments of the invention provide a method of fabricating a device coupon including a waveguide, for use in a micro-transfer printing process, the method comprising the steps, on a wafer, of:
  depositing a lower cladding layer on an uppermost surface of the wafer;
  providing a silicon nitride guiding layer on an uppermost surface of the lower cladding;
  depositing an upper cladding over at least an uppermost surface of the silicon nitride guiding layer;
  providing a tether over the coupon, and etching away a region of the uppermost layer of the wafer located between the lower cladding layer and a substrate of the wafer, thereby leaving the lower cladding layer, silicon nitride guiding layer, and upper cladding layer suspended above the wafer via the tether.

Such a method addresses the issues identified above, and provides an improved yield of devices.

The method may have any one or, to the extent that they are compatible, any combination of the following optional features.

Providing the silicon nitride layer may include the steps of:
  bulk depositing silicon nitride over the uppermost surface of the lower cladding; and
  etching the deposited silicon nitride to define a silicon nitride guiding layer.

The method may further include a step, between depositing the upper cladding layer and providing the tether, of etching one or more facets into the silicon nitride guiding layer. Etching the one or more facets into the silicon nitride guiding layer may include depositing a photoresist over a portion of the upper surface of the upper cladding, and completely etching the exposed upper cladding and silicon nitride guiding layer.

Etching the one or more facets into the silicon guiding layer may include partially etching the lower cladding layer. The remaining lower cladding layer, located adjacent to the etching facets, may have a thickness of up to 200 nm.

The method may further include a step, performed after etching the one or more facets, of depositing a protective layer of the etched facets. The protective layer may be formed of silicon dioxide. The protective layer may have a thickness of around 200 nm.

The tether may be formed from silicon nitride.
Providing the tether may include the steps of:
  etching away an exposed uppermost layer of the wafer, leaving the region of the uppermost layer of the wafer located between the lower cladding and the substrate of the wafer;
  bulk depositing the tether over the exposed upper surface of the coupon and at least partially over the wafer;
  patterning the tether with a mask; and
  etching the unmasked portions of the tether.

Etching away the uppermost layer of the wafer may include performing a wet etch. The etchant used in the wet etch may be tetramethylammonium hydroxide.

The wafer may be a silicon-on-insulator wafer and the uppermost surface of the wafer may be provided by a silicon device layer.

The lower cladding layer and/or the upper cladding layer may be formed of silicon dioxide.

The upper cladding layer and/or the lower cladding layer may be formed of silicon nitride, having a lower refractive index than a refractive index of the silicon nitride guiding layer. THE wafer may be a silicon wafer and the uppermost surface of the wafer may be provided by a silicon dioxide layer. The etchant used in the wet etch may comprise hydrogen fluoride (HF).

The silicon nitride guiding layer may have a composition $Si_3N_4$.

In a second aspect, embodiments of the present invention provide a device coupon, suitable for use in a micro-transfer printing process, the coupon comprising:
  a waveguide, formed of:
    a lower cladding layer;
    an upper cladding layer; and
    a silicon nitride guiding layer, located between the lower cladding layer and the upper cladding layer,
    the coupon also comprising a tether.

Such a device coupon can be used in a micro-transfer printing process which provides an improved yield.

The device coupon may have any one or, to the extent that they are compatible, any combination of the following optional features.

The tether may couple the coupon to a wafer, such that there is a gap between a lower surface of the lower cladding layer and an upper surface of an upper cladding layer.

The lower cladding layer and/or upper cladding layer may be formed of silicon dioxide.

The lower cladding layer and/or upper cladding layer may be formed of silicon nitride, having a lower refractive index than a refractive index of the silicon nitride guiding layer.

The silicon nitride guiding layer may have a composition of $Si_3N_4$.

In a third aspect, embodiments of the present invention provide a method of manufacturing an optoelectronic device, comprising the steps of:

providing a platform wafer, the platform wafer including a cavity; and micro-transfer printing the device coupon of the second aspect into the cavity.

The method may have any one or, to the extent that they are compatible, any combination of the following optional features.

The device coupon used in the third aspect may have any one, or any combination insofar as they are compatible, of the optional features of the device coupon of the second aspect.

The method may further comprise a step of bonding the device coupon to a bed of the cavity.

The method may further comprise a step of etching away one or more protective layers present over respective facets of the silicon nitride guiding layer.

In a fourth aspect, embodiments of the present invention provide an optoelectronic device produced using the method of the third aspect.

The invention includes the combination of the aspects and preferred features described except where such a combination is clearly impermissible or expressly avoided.

Further aspects of the present invention provide: a computer program comprising code which, when run on a computer, causes the computer to perform the method of the first and third aspects; a computer readable medium storing a computer program comprising code which, when run on a computer, causes the computer to perform the method of the first and third aspects; and a computer system programmed to perform the method of the first and third aspects.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES

Aspects and embodiments of the present invention will now be discussed with reference to the accompanying figures. Further aspects and embodiments will be apparent to those skilled in the art.

FIGS. 1A to 16B show various steps of a method of fabricating a device coupon. Typically herein, a figure reference ending in 'A' is a top-down view and a figure reference ending 'B' is a cross-sectional view.

Figure 1A:
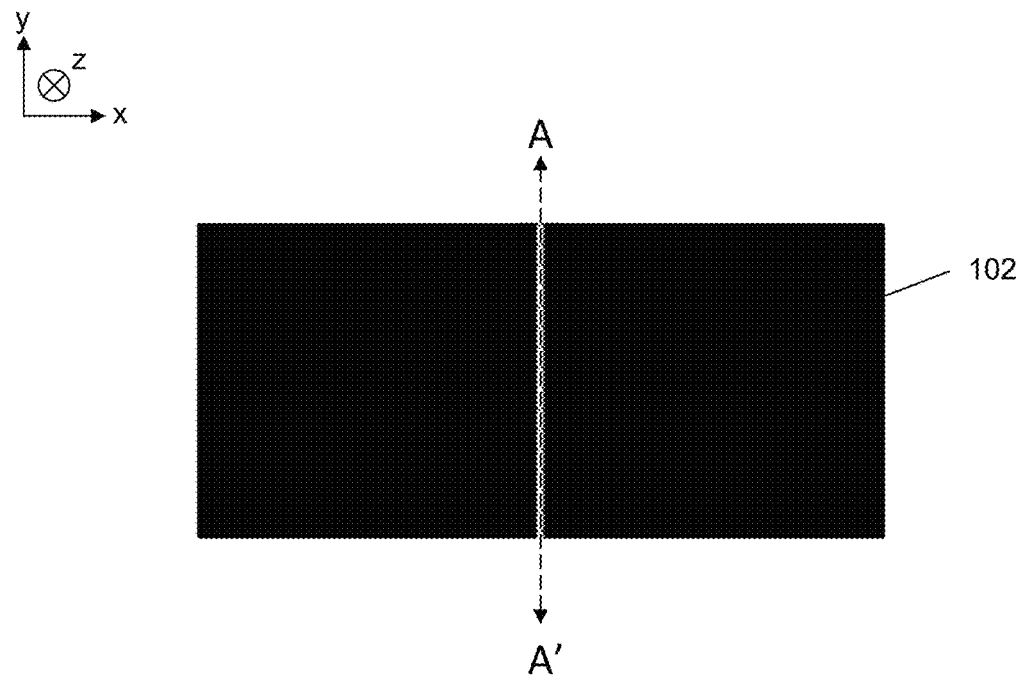
FIGS. 1A to 16B show various steps of a method of fabricating a device coupon.
Figure 1B:
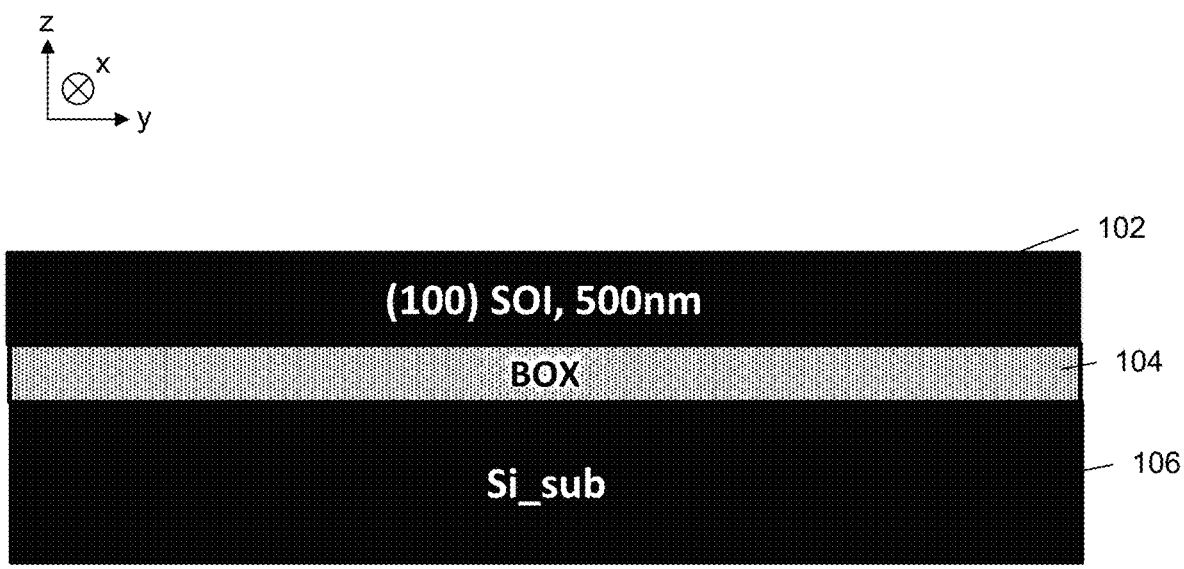

In a first step, shown from a top-down view in FIG. 1A and in a cross-sectional view (along the line A-A') in FIG. 1B, a silicon-on-insulator (SOI) wafer is provided. This wafer, as it is used to produce the device coupon, may be referred to as a coupon wafer. The SOI wafer comprises a silicon substrate (Si_sub) 106, above which is a buried oxide layer 104. The buried oxide layer may be formed from silicon dioxide. A silicon device layer 102 is located above the buried oxide layer, i.e. on an opposing side of the buried oxide layer to the silicon substrate. The silicon device layer, also referred to as silicon-on-insulator (SOI) layer, has in this example a thickness of around 500 nm. The thickness is measured from an uppermost surface of the buried oxide layer to an uppermost surface of the SOI layer 102 (i.e. the one furthest from the buried layer). The SOI layer 102 in this example has a crystallographic orientation of (100).

Figure 2A:
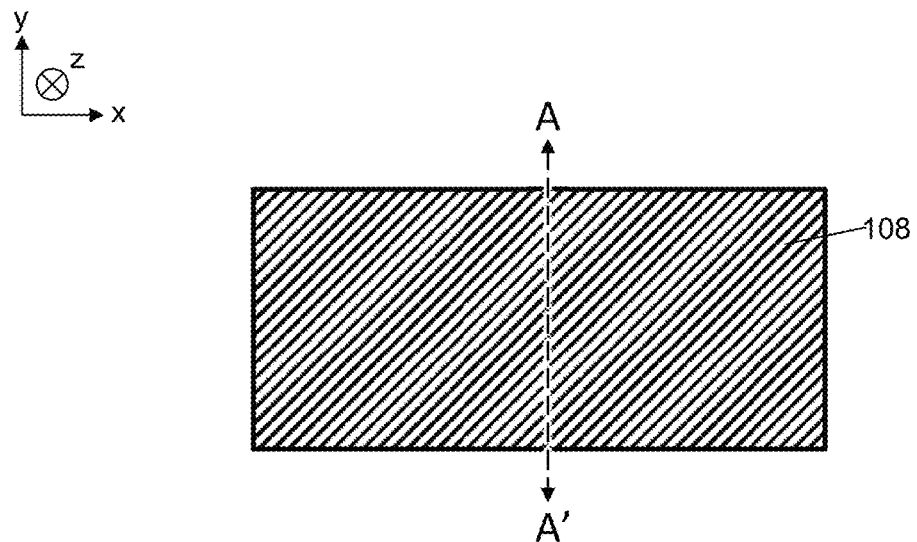
Figure 2B:
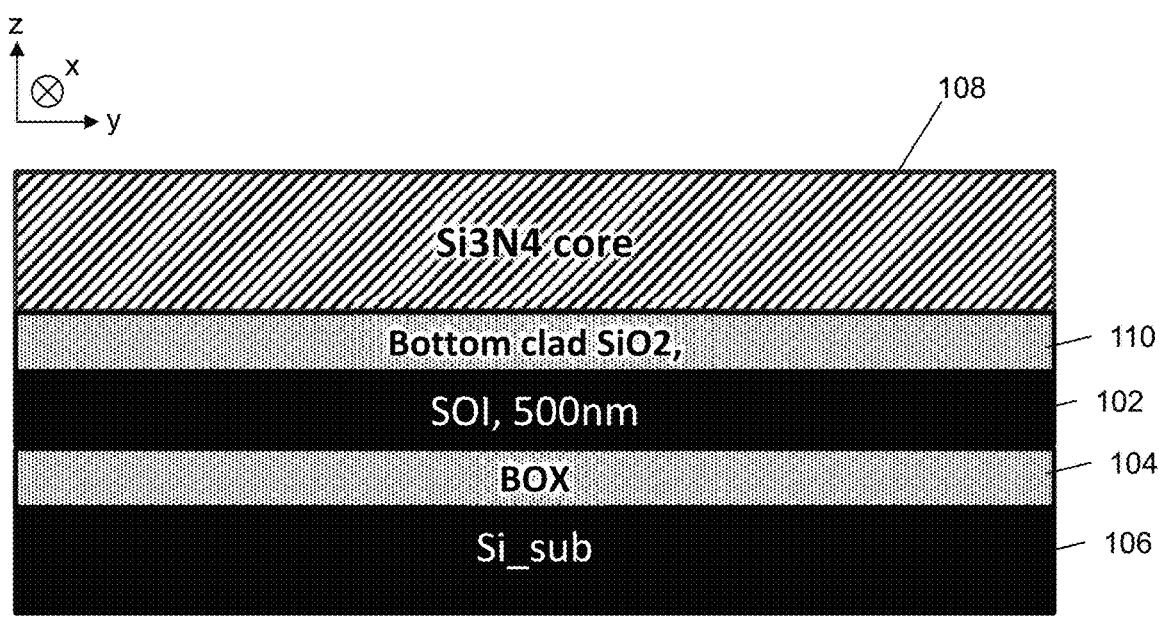
Figure 3A:
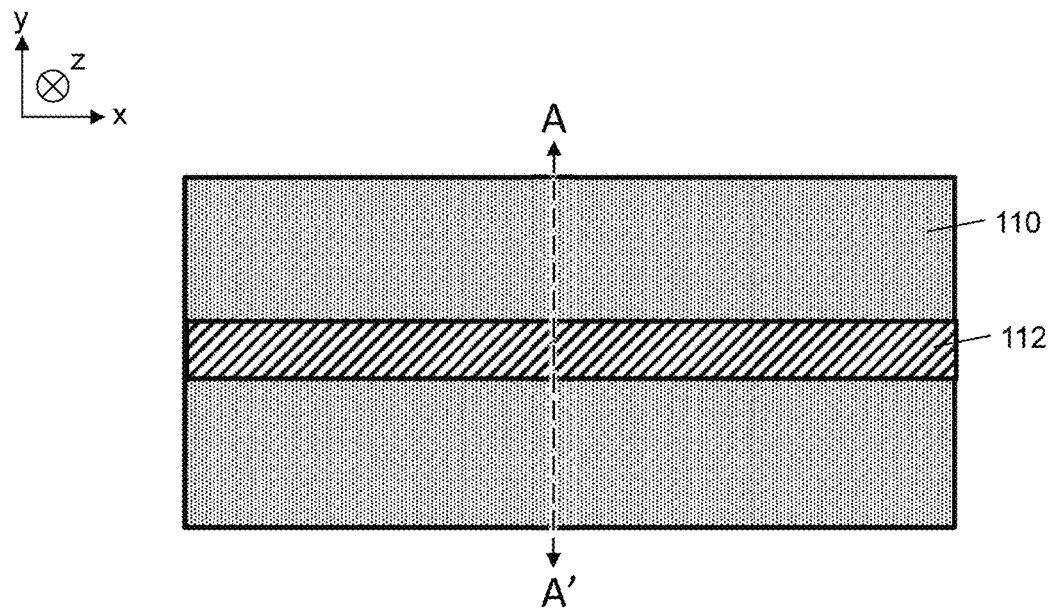
Figure 3B:
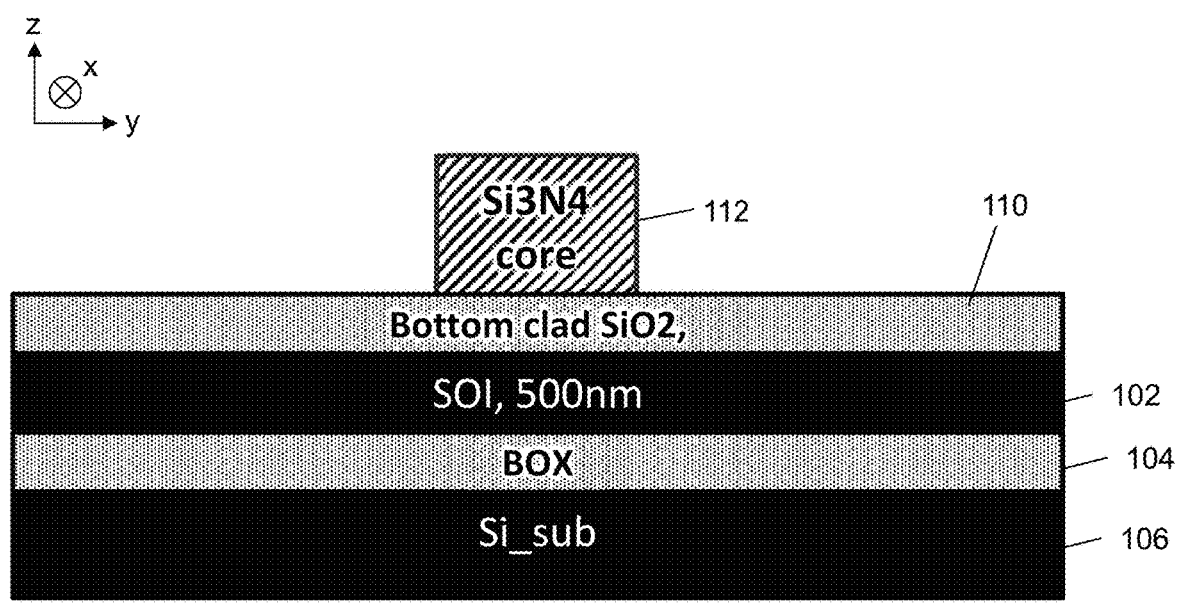

Next, in a step shown from a top-down view in FIG. 2A and in a cross-sectional view (along the line A-A') in FIG. 2B, a bottom cladding layer 110 is deposited above the SOI layer 102. Then, a silicon nitride layer 108 is deposited above the bottom cladding layer 110. In this example, the bottom cladding layer 110 is formed of silicon dioxide ($SiO_2$) and the silicon nitride layer has the composition $Si_3N_4$. The silicon nitride layer is then etched to provide a silicon nitride waveguide core 112, as shown in FIGS. 3A and 3B. This step can include, for example, the deposition of a mask, patterning of the mask to define the waveguide core, and etching of the unmasked regions.

Figure 4A:
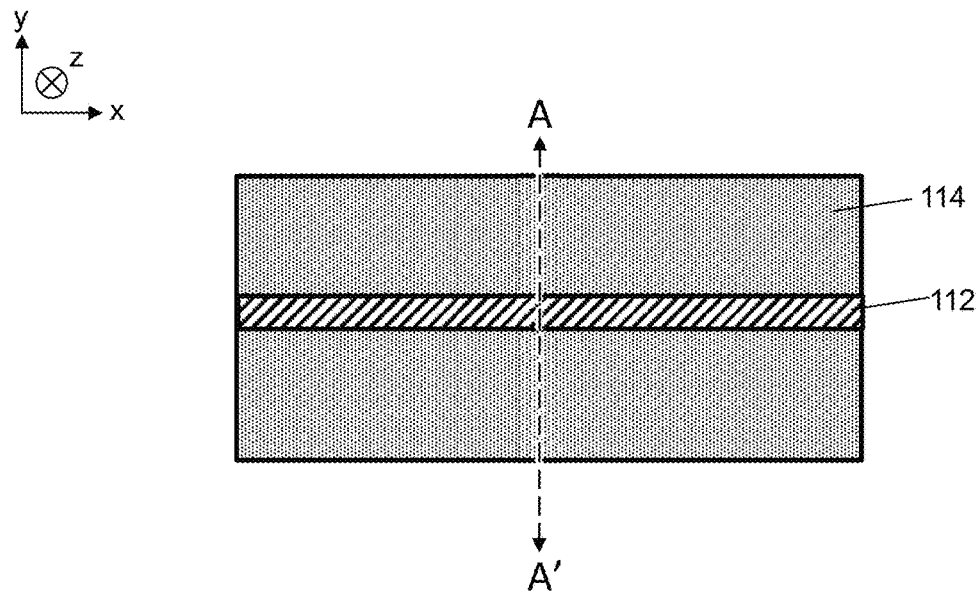
Figure 4B:
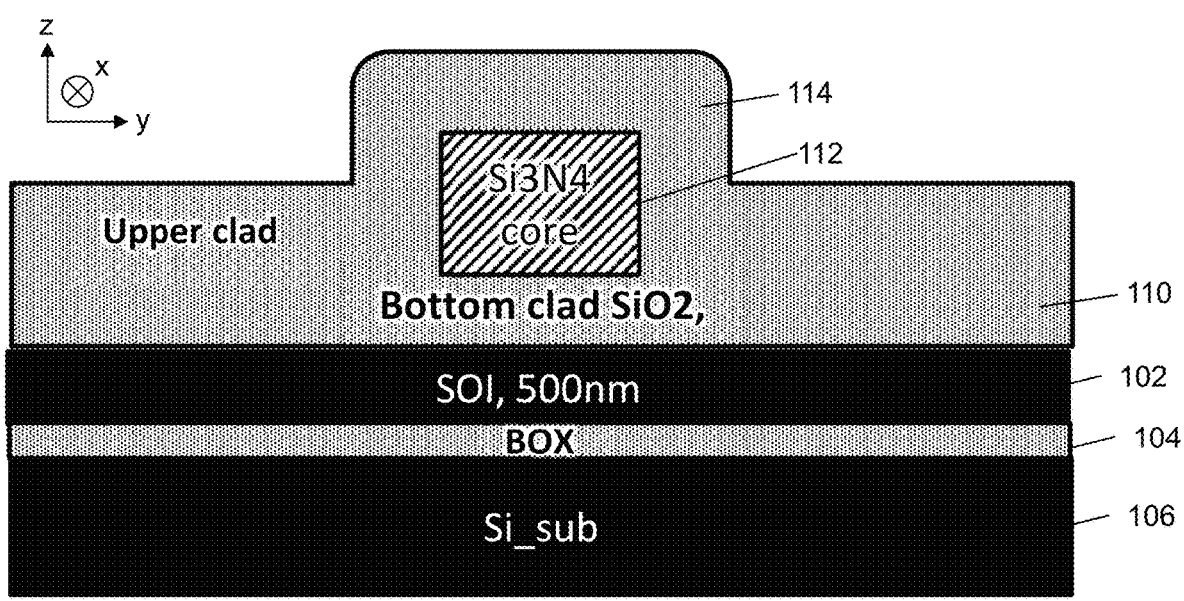
Figure 5A:
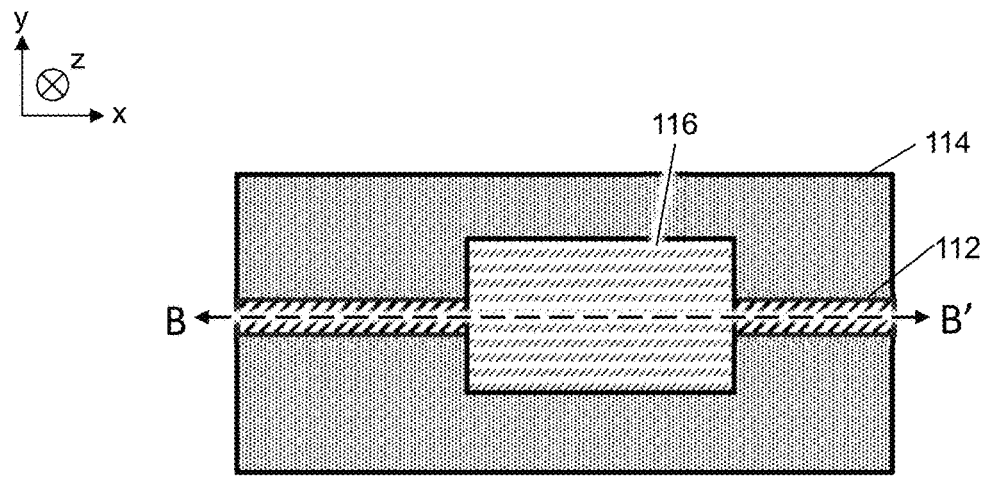
Figure 5B:
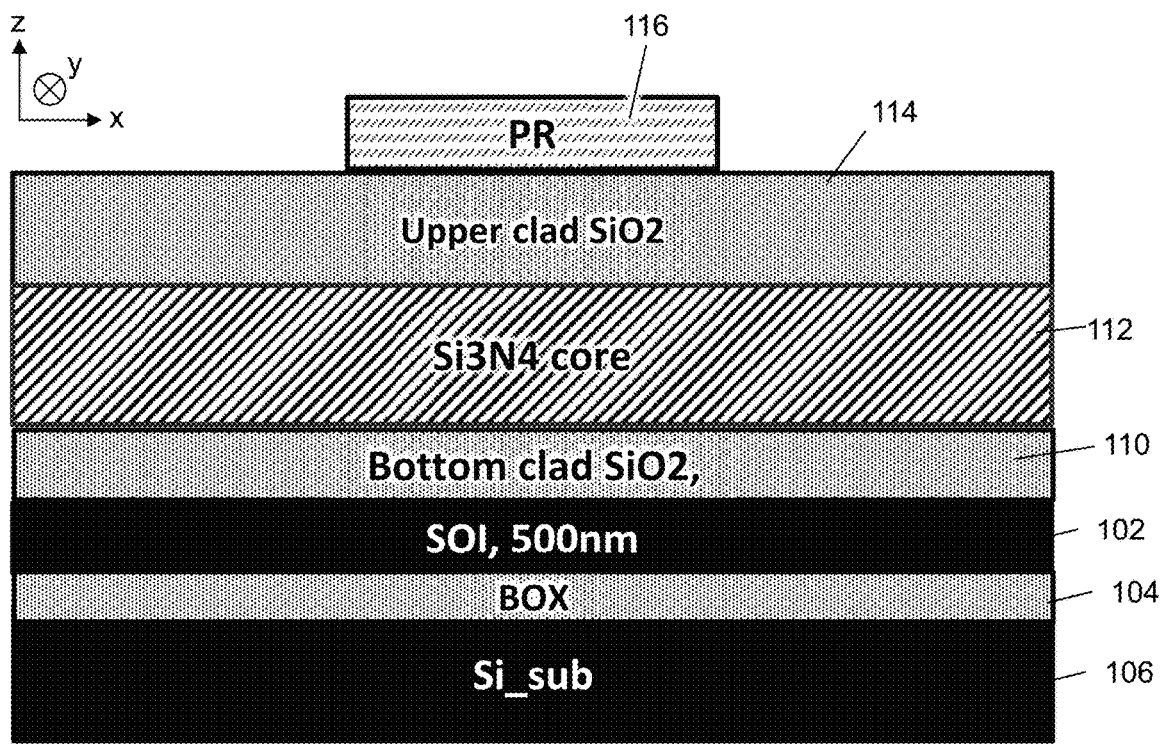
Figure 6A:
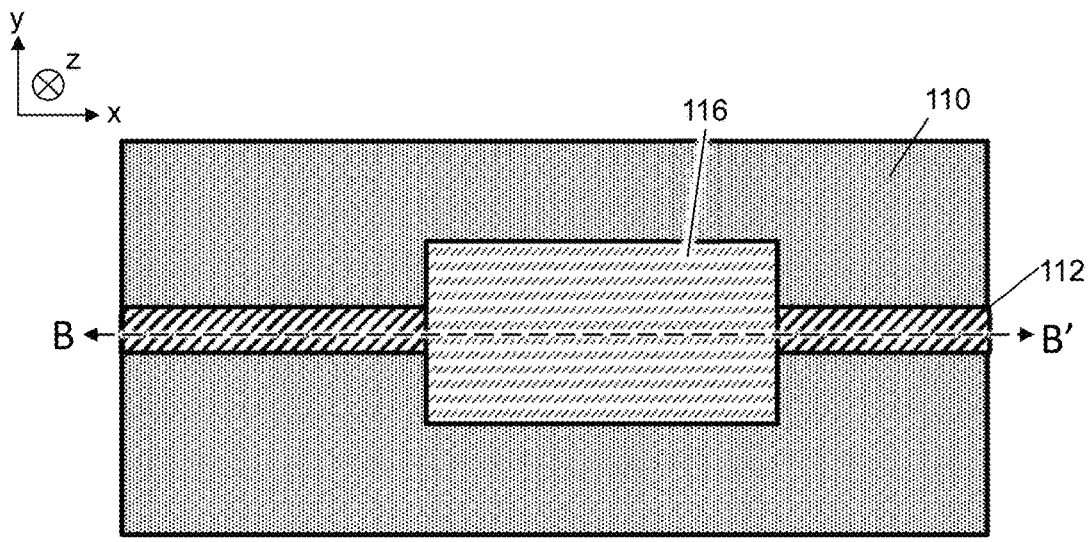
Figure 6B:
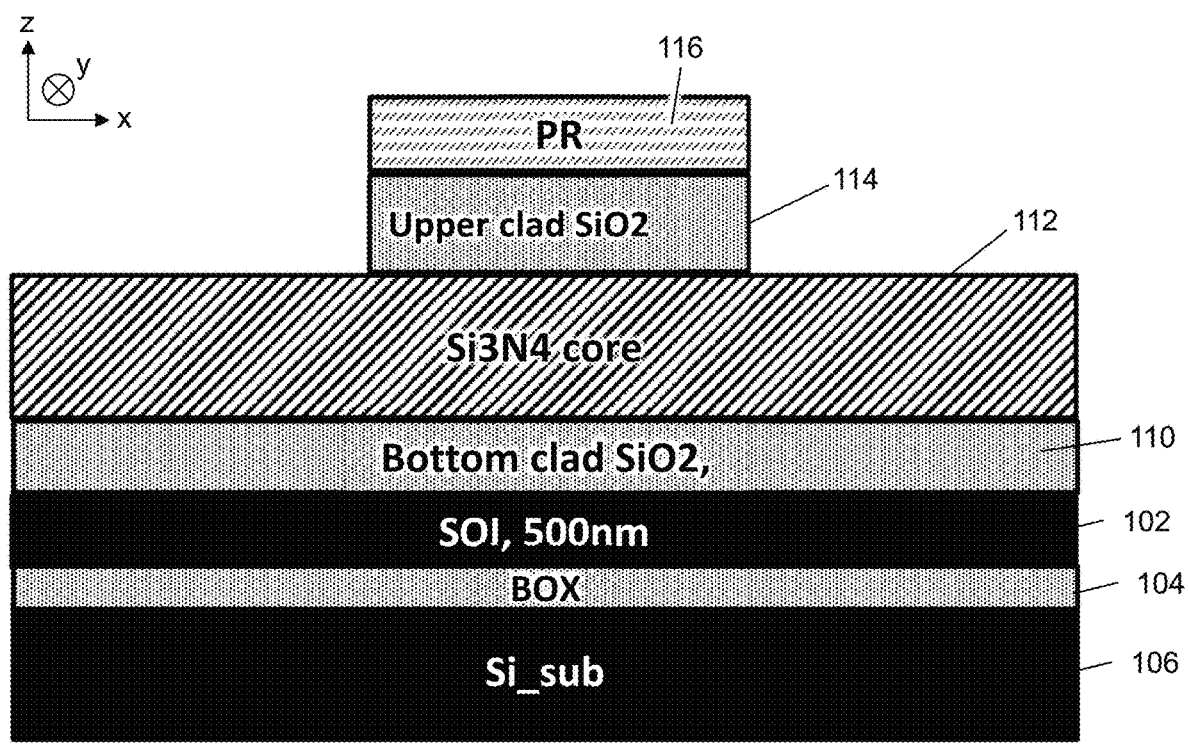

After the waveguide core 112 has been etched, further silicon dioxide is deposited to provide the upper cladding layer 114. In this example, the upper cladding layer is formed of $SiO_2$. The result of this is shown in FIGS. 4A and 4B (top-down and cross-sectional respectively). Next the coupon is patterned. That is, in this example, a photoresist 116 is bulk deposited and then structures defined through photolithography to prepare the coupon for a facet etching step. This is shown in FIGS. 5A and 5B, where FIG. 5B is a cross-section along the line B-B' of FIG. 5A. Using the photoresist 116 as a mask, the upper cladding 114 not covered by the photoresist is etched away exposing a portion of the silicon nitride core 112. The result of this is etch is shown in FIGS. 6A and 6B, where FIG. 6B is a cross-section along the line B-B' of FIG. 6A.

Figure 7A:
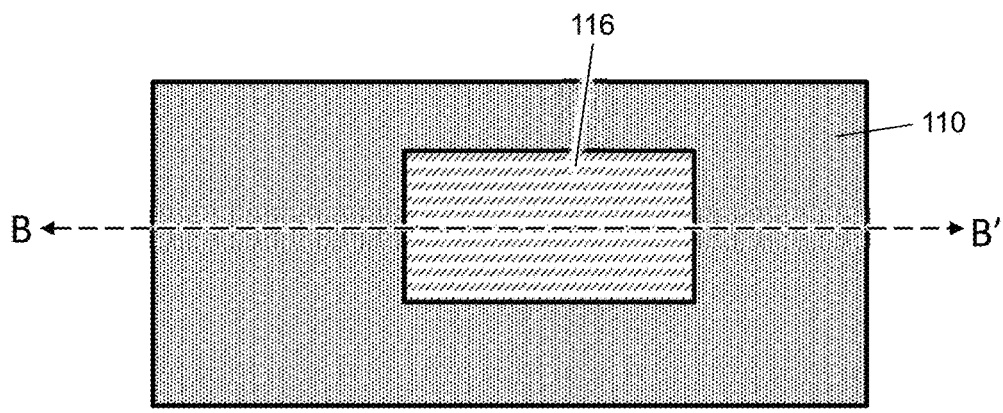
Figure 7B:
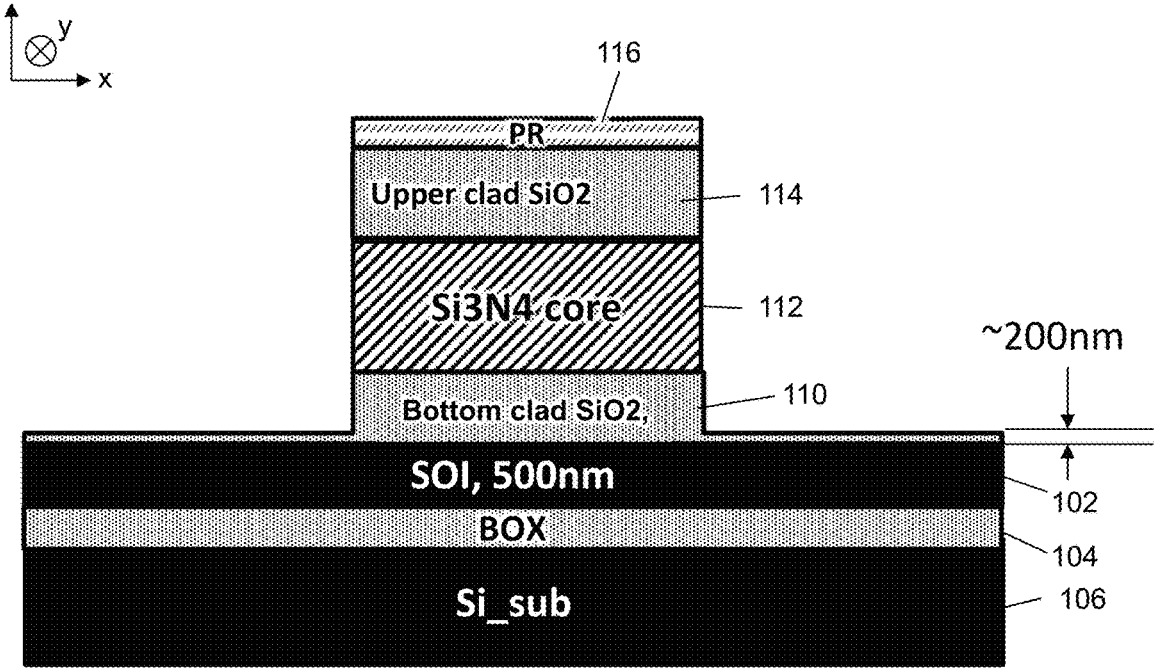
Figure 8A:
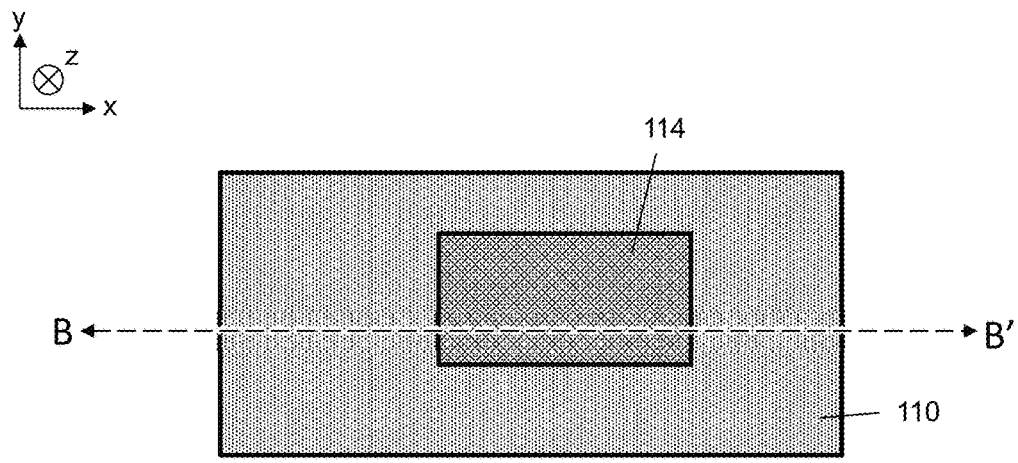
Figure 8B:
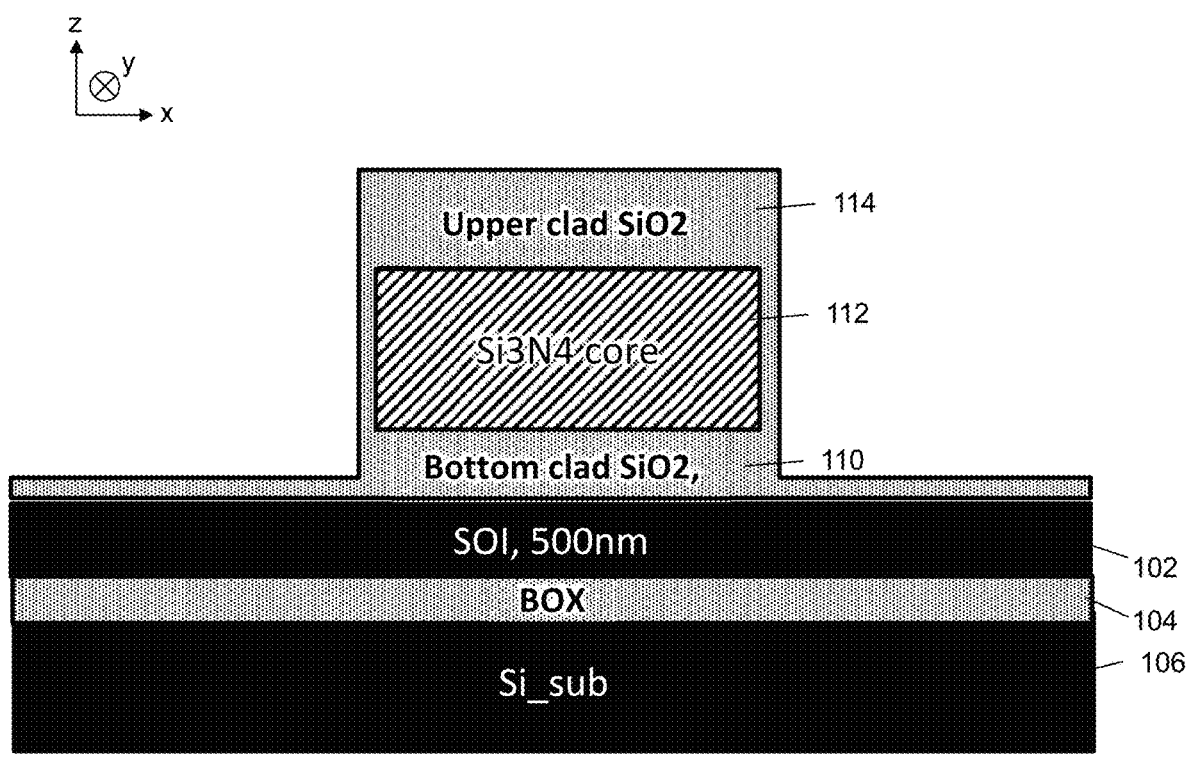

Next, in a step shown in FIGS. 7A and 7B, the silicon nitride core 112 not covered by photoresist 116 is etched away as is at least a part of the bottom cladding 110 also not covered by the photo resist. In this example, a layer of bottom cladding layer 110 is left either side of the remaining stack (formed of the photoresist, upper cladding, core, and bottom cladding) which has a thickness of around 200 nm. Subsequently, a protection layer (in this example formed of silicon dioxide) is deposited over the exposed surfaces of the coupon. This is shown in FIGS. 8A and 8B.

Figure 9A:
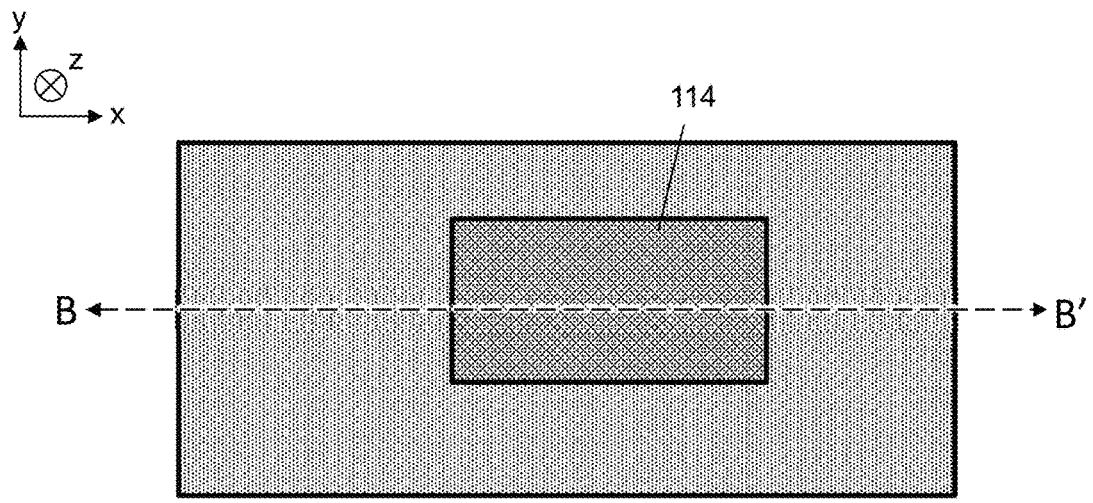
Figure 9B:
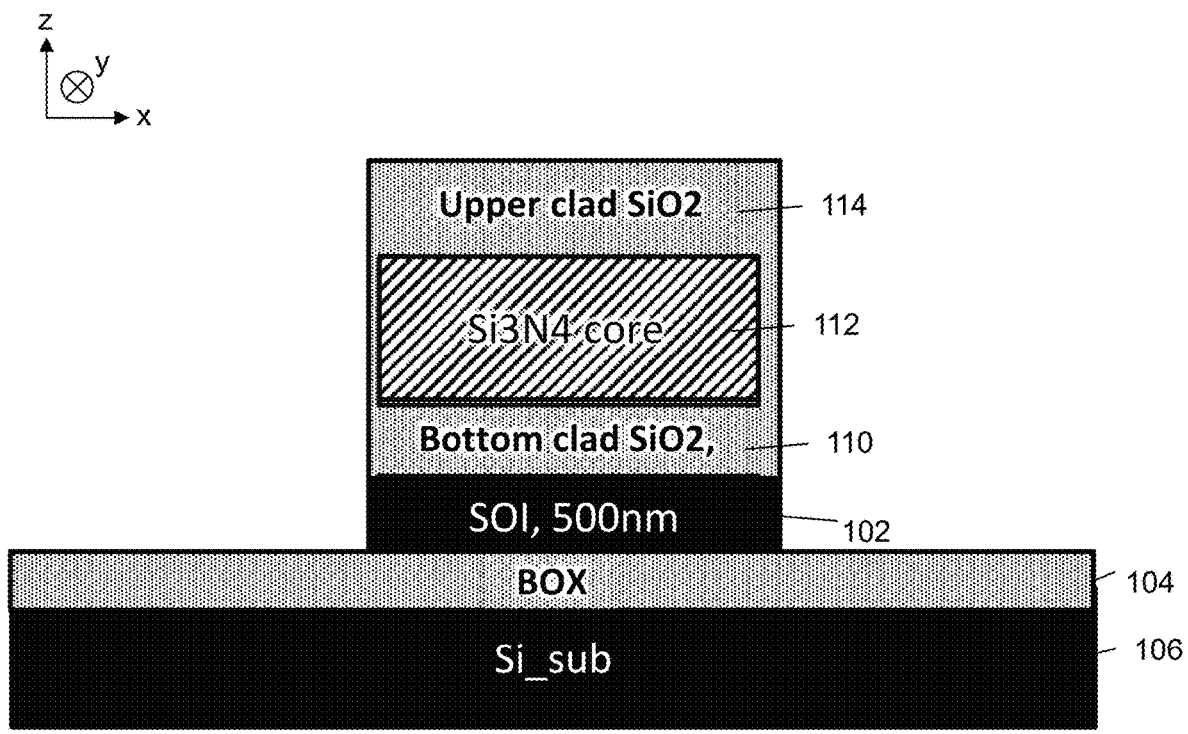
Figure 10A:
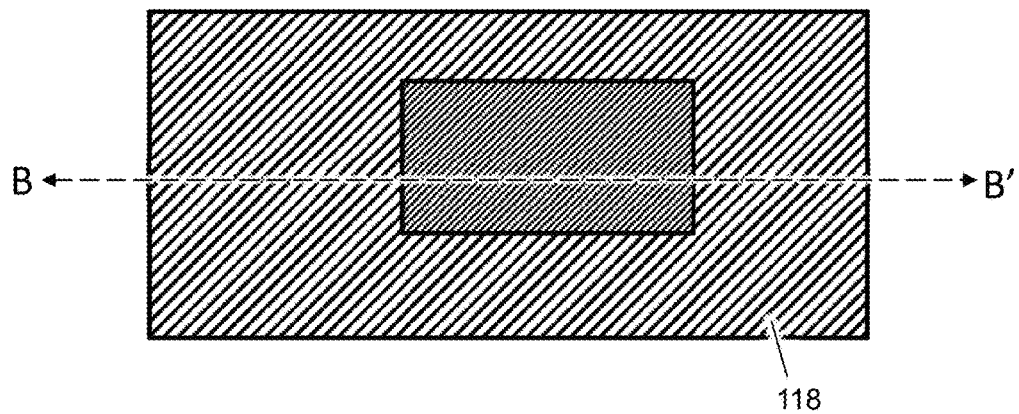
Figure 10B:
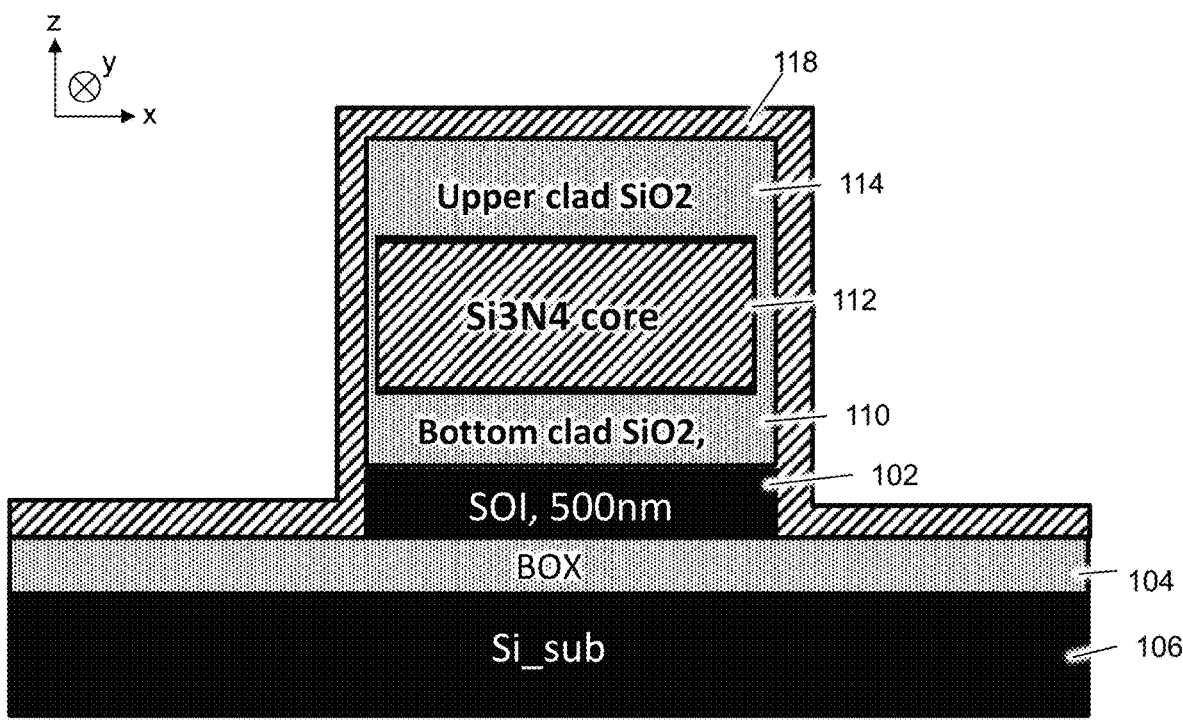

Next, in a step shown in FIGS. 9A and 9B, an anisotropic dry etch is performed to remove the layer of bottom cladding not within the stack (i.e. the silicon dioxide which surrounds the stack on the wafer) as well as the portion of the SOI layer which is not within the stack. FIGS. 10A and 10B illustrate a further step, where a silicon nitride tether layer 118 (in this example having the composition $Si_3N_4$) is deposited over the exposed surfaces of the coupon wafer. In FIG. 10A, the tighter shading indicates a difference in height between the centre portion of silicon nitride directly above the stack and the silicon nitride over the remaining wafer.

Figure 11A:
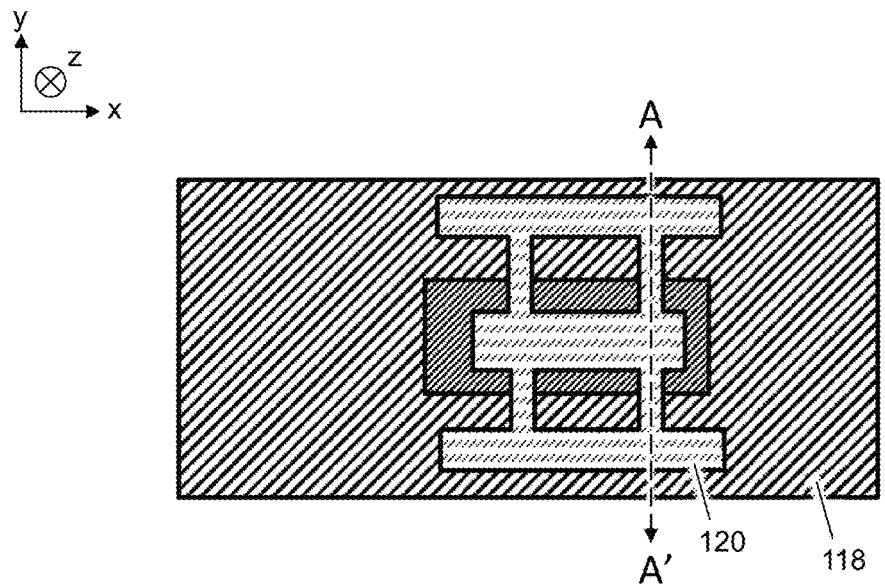
Figure 11B:
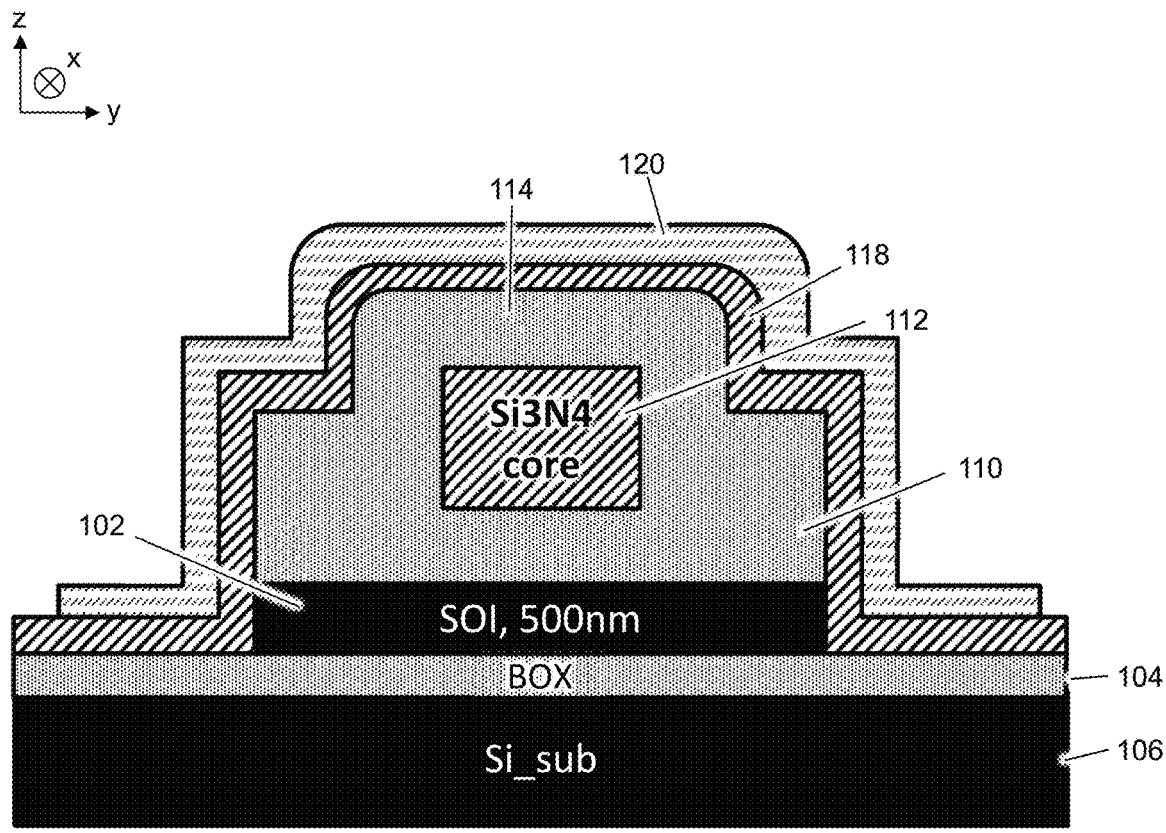
Figure 12A:
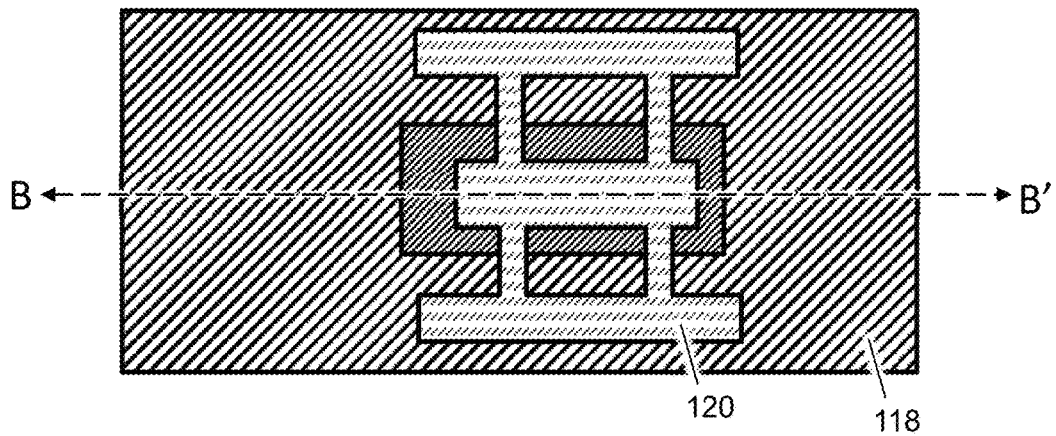
Figure 12B:
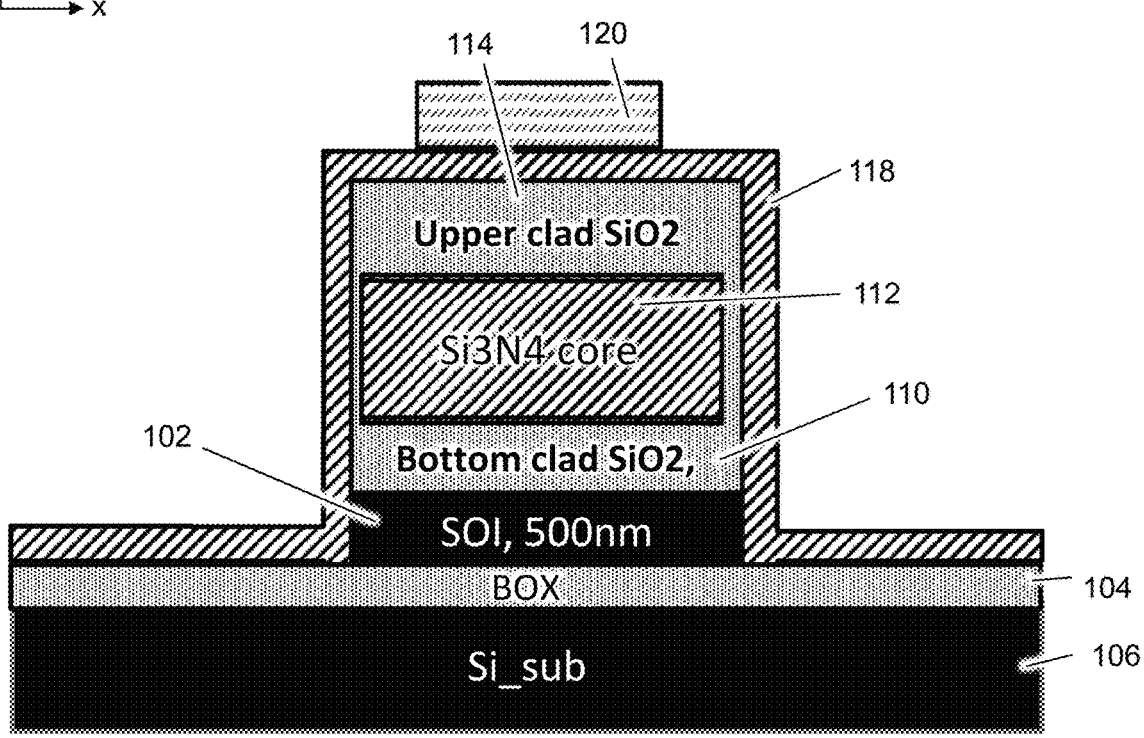
Figure 13A:
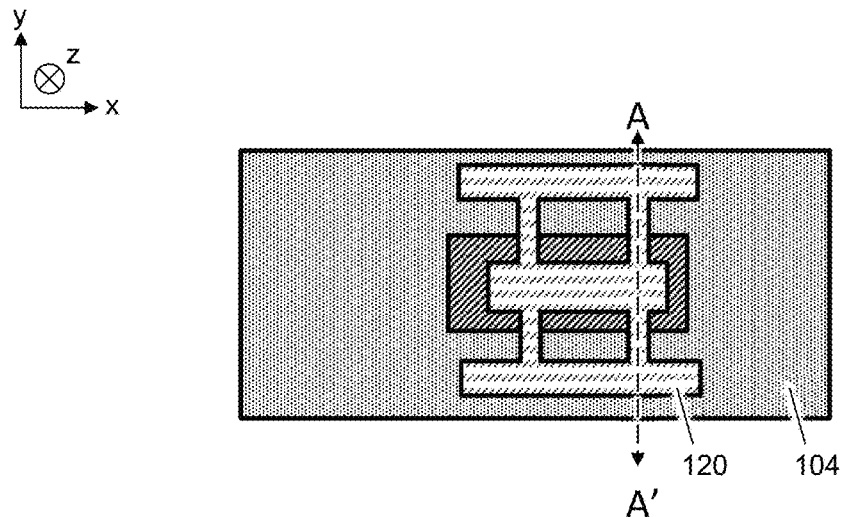
Figure 13B:
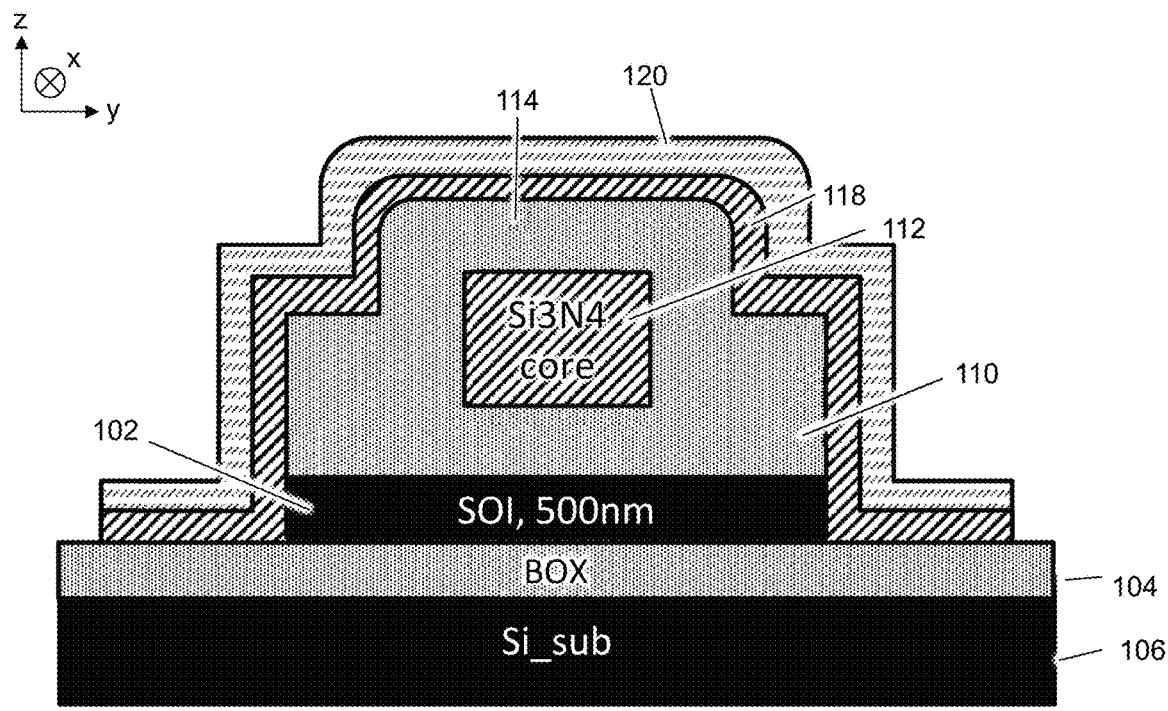
Figure 14A:
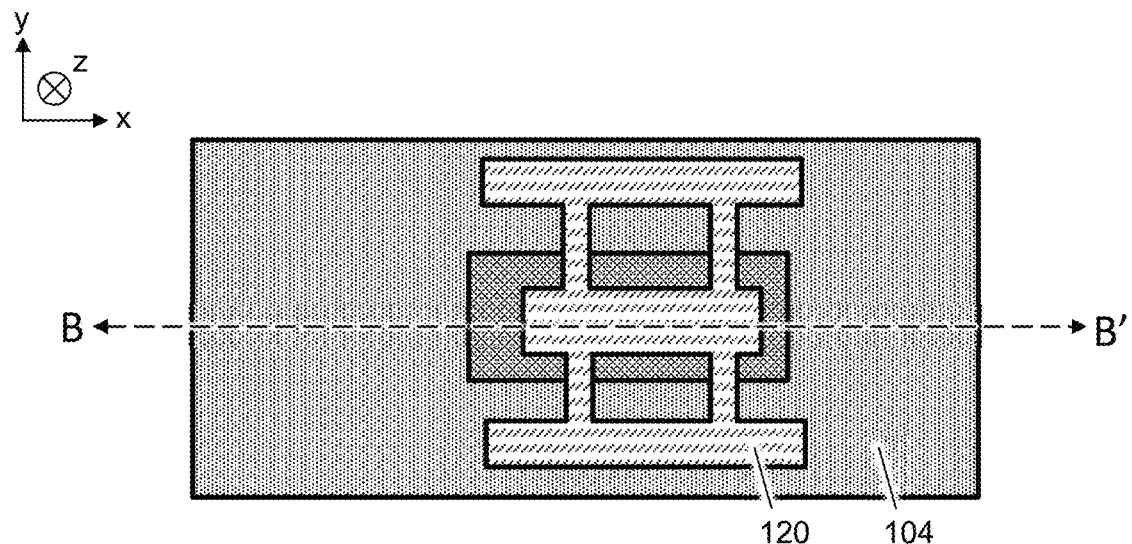
Figure 14B:
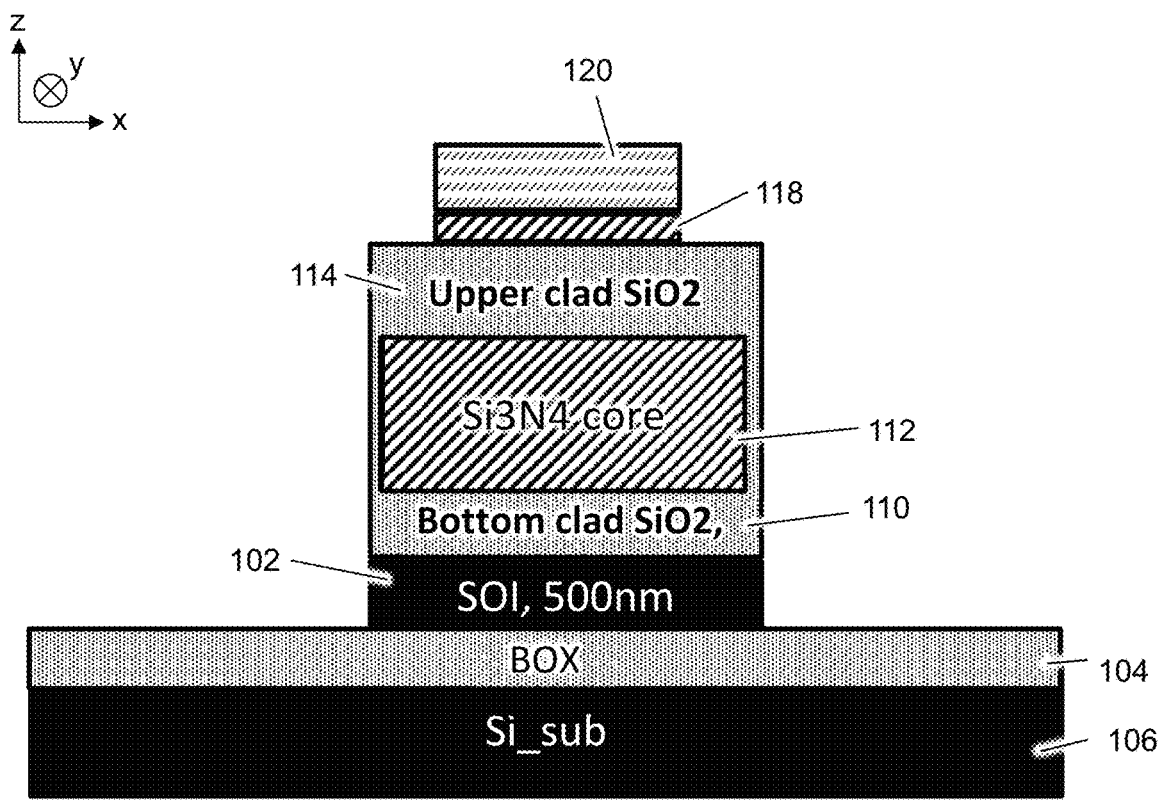
Figure 15A:
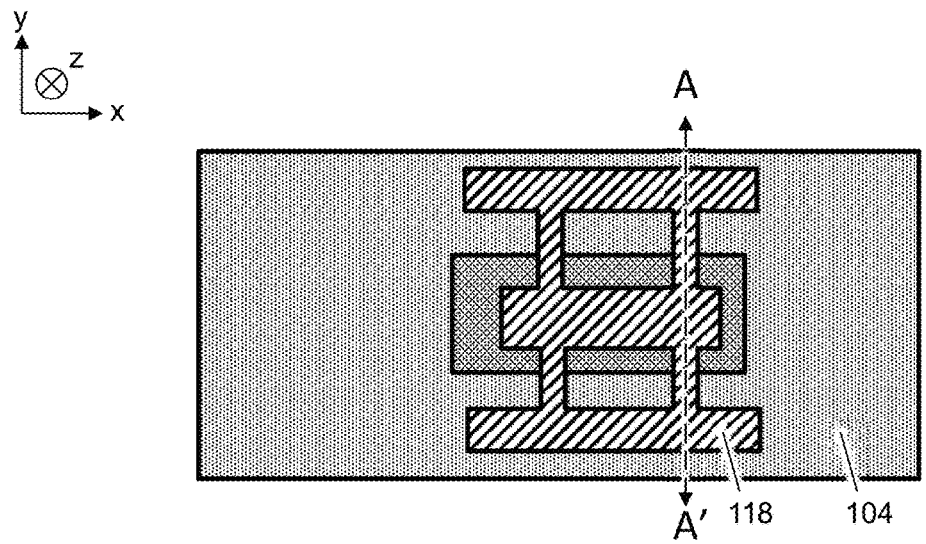
Figure 15B:
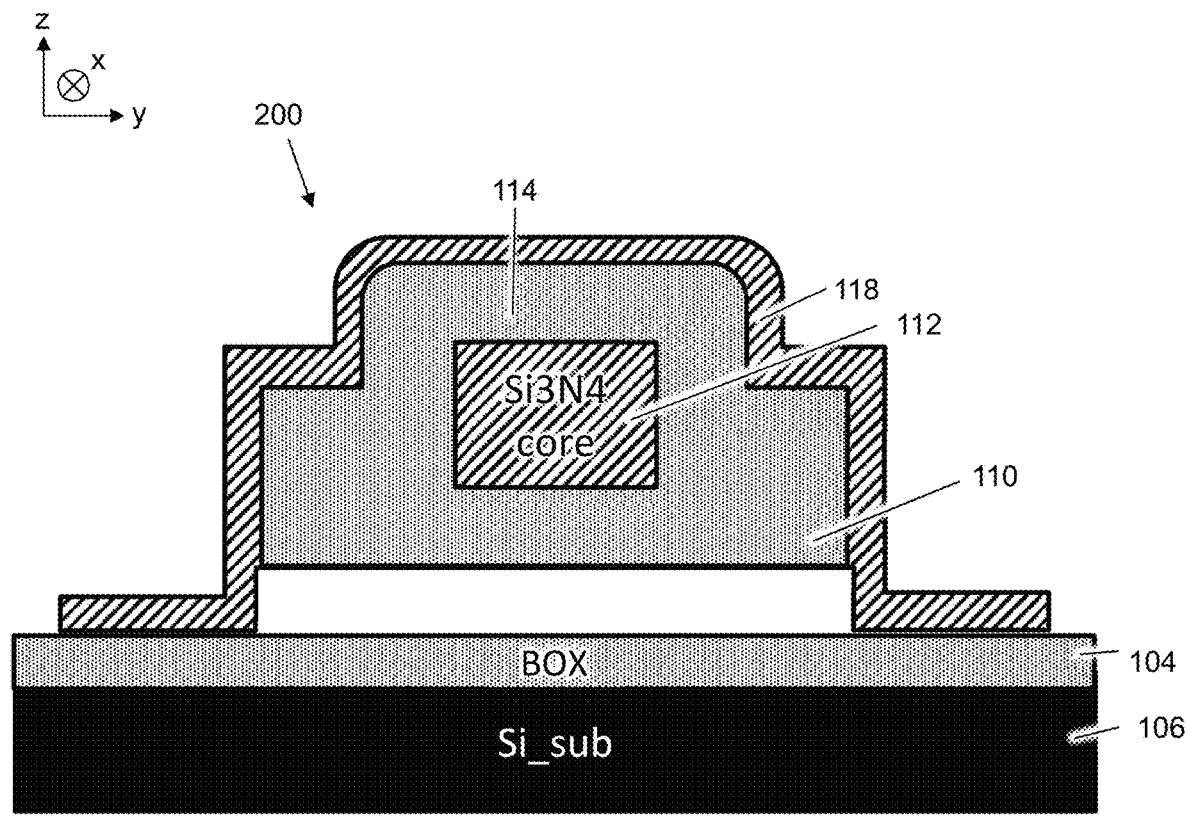
Figure 16A:
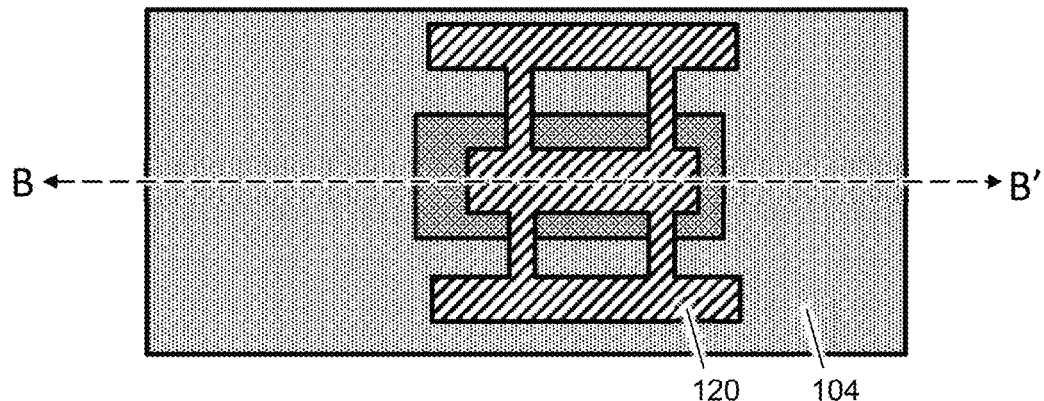
Figure 16B:
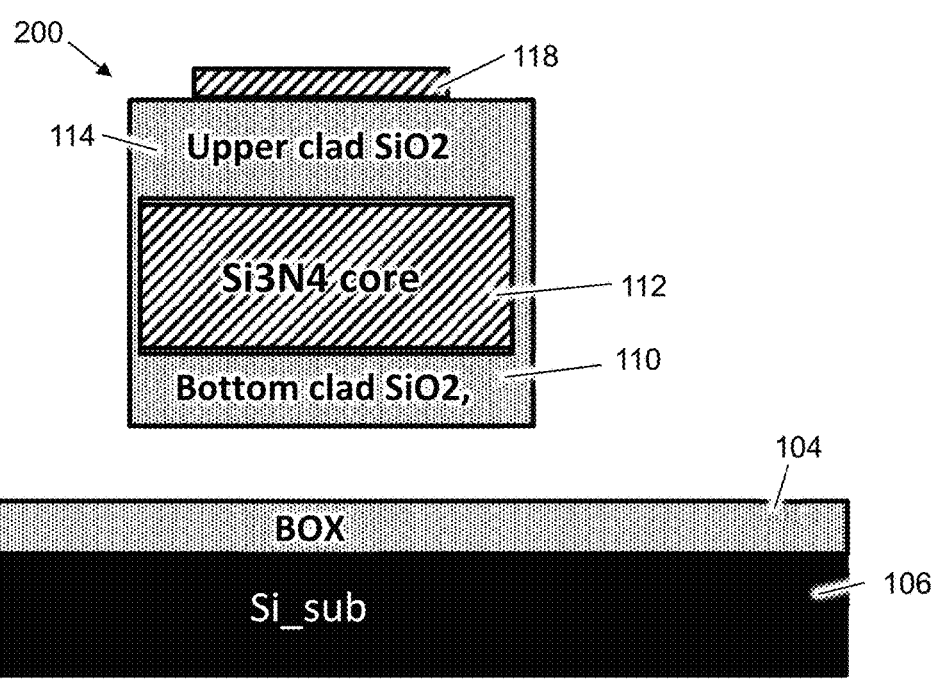

Subsequently, in a step shown in FIGS. 11A and 11B, a further photoresist 120 is deposited and patterned to define the silicon nitride tether. As shown, the tether comprises a plurality of arms which extend from a central support beam on the top of the stack, down vertical sides of the stack, to contact respective base pads located on the coupon wafer. In the specific example shown, there are four arms, two on each lateral side of the stack, each pair connecting to a respective base pad located on the coupon wafer. FIGS. 12A and 12B illustrate the same step, but with FIG. 12B being a cross-section along the lines B-B' of FIG. 12A. The unmasked portions of the silicon nitride layer are then etched away, leaving only the silicon nitride tether layer 118 located underneath the photoresist 120. The result of this is shown in FIGS. 13A and 13B, and 14A and 14B. This etch, as shown most clearly in FIG. 14B, exposes the silicon device layer 102 within the stack. This allows for a wet etch to be performed which removes the SOI layer. The wet etch in this example uses tetramethylammonium hydroxide. The result of the wet etch is shown in FIGS. 15A and 15B and 16A and 16B. The device coupon 200 is now complete, and is adhered to the buried oxide layer 104 of the coupon wafer solely by the silicon nitride tether 118.

Figure 17:
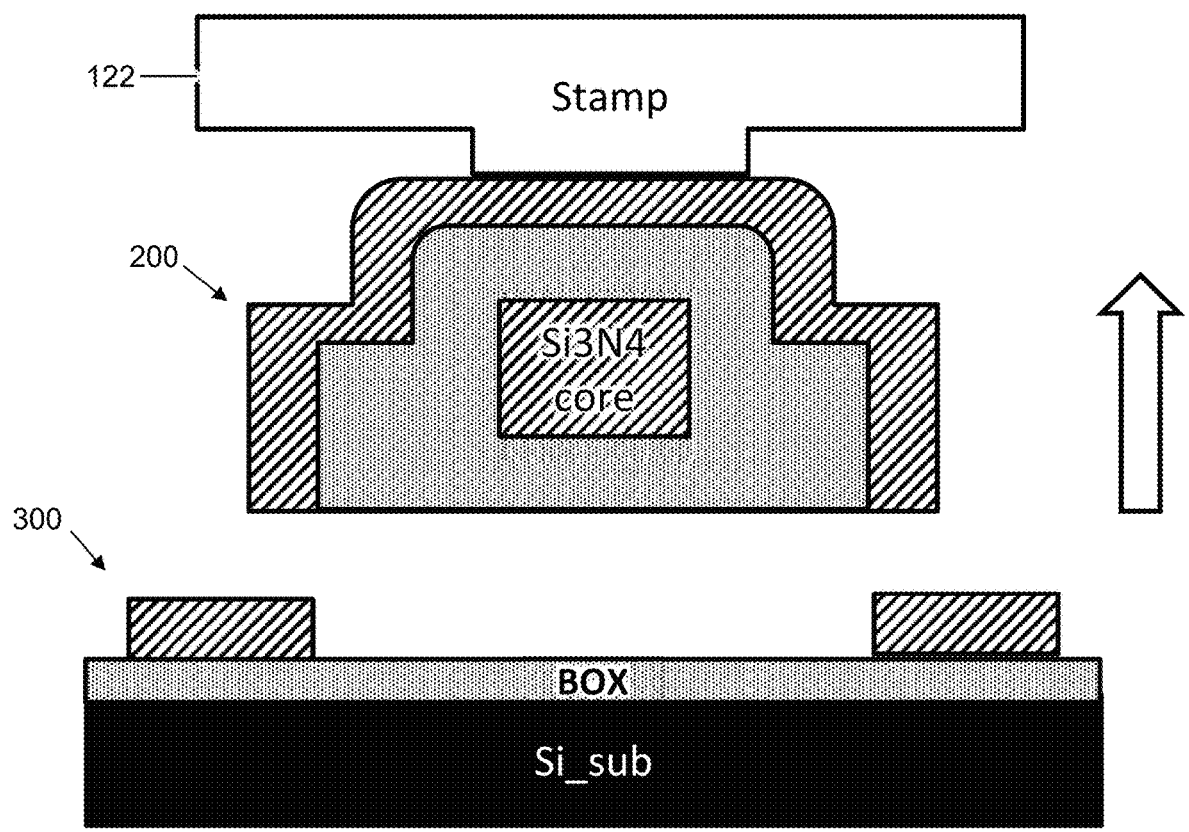
FIGS. 17 to 20 show various steps of a method of manufacturing an optoelectronic device.
Figure 18:
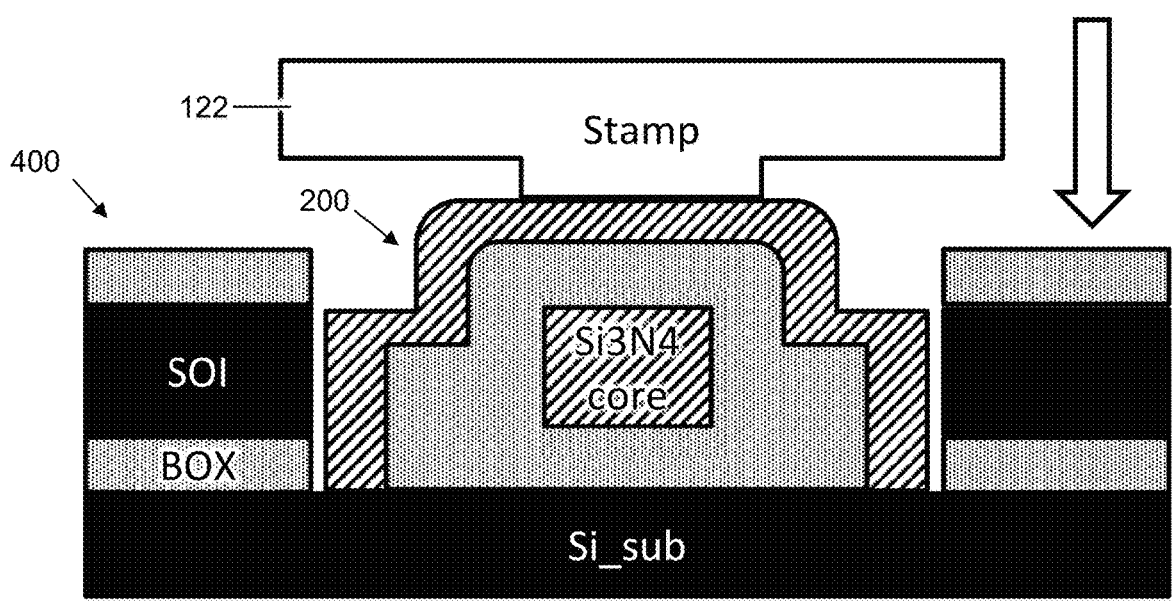

FIGS. 17 to 20 show various steps of a method of manufacturing an optoelectronic device. A stamp 122, in this example an elastomer stamp, is adhered to the upper surface and used to lift the device coupon 200 away from the coupon wafer 300, thereby breaking the tethers. This is shown in FIG. 17. The device coupon is then transferred to a platform wafer 400, and printed. In this example, the device coupon 300 is printed into a cavity formed by removing portions of an upper oxide layer, a silicon device layer, and a buried oxide layer. The device coupon is printed directly onto an upper surface of the silicon substrate. This is shown in FIG. 18.

Figure 19A:
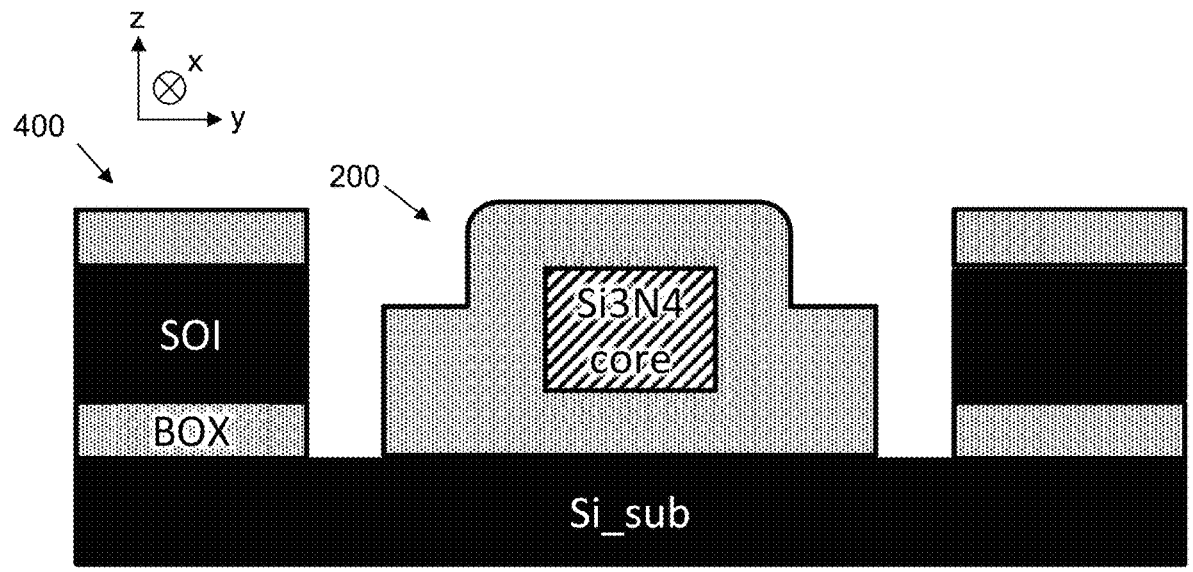
Figure 19B:
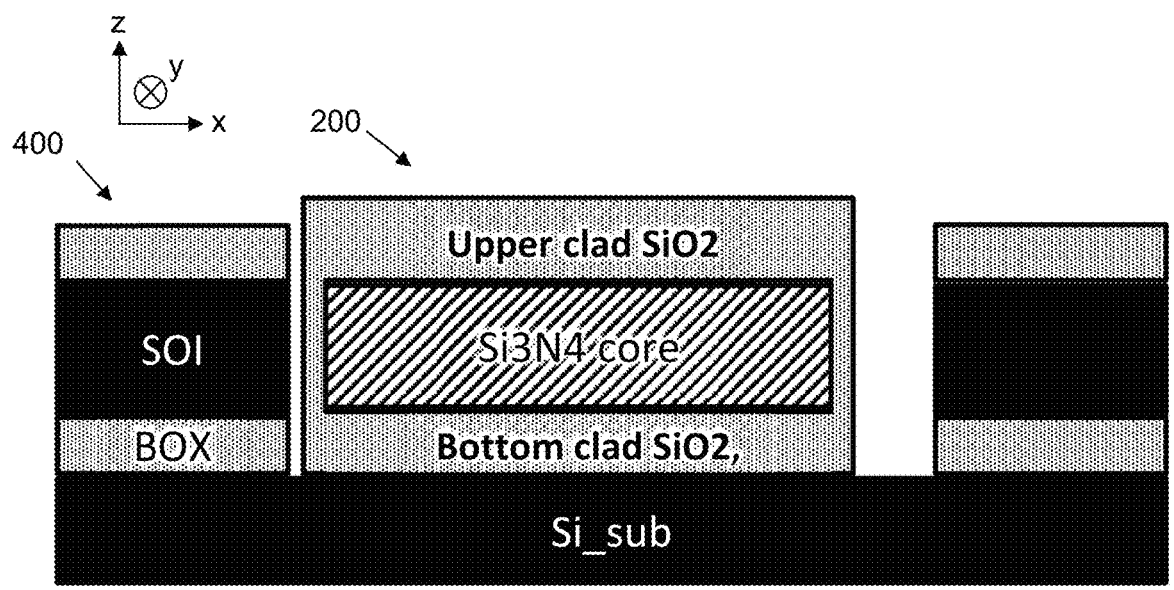
Figure 20:
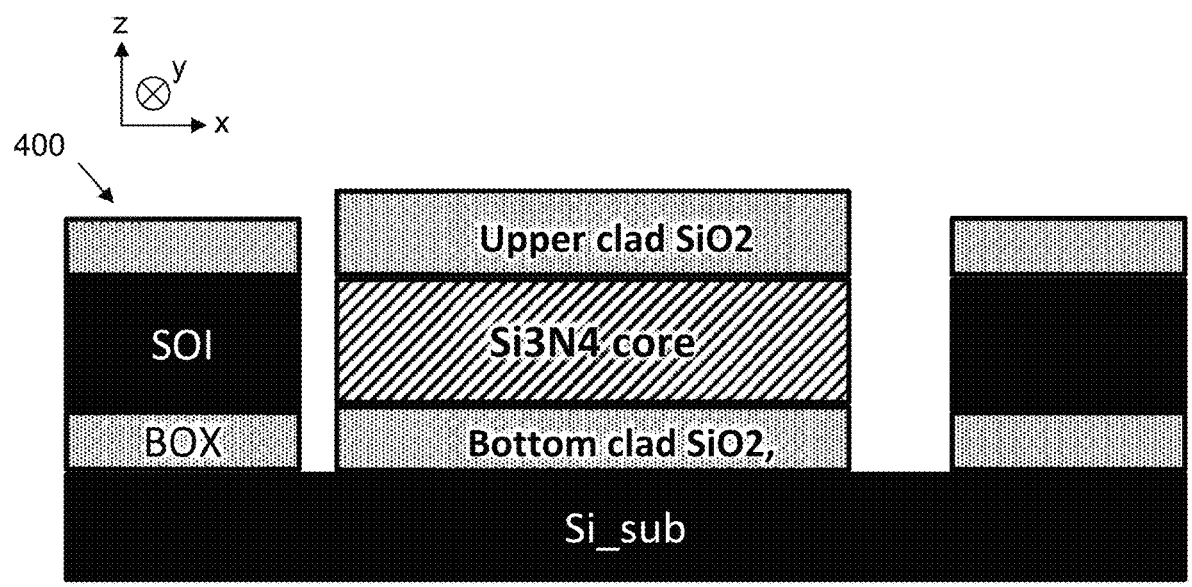

The stamp is then released, and the silicon nitride tether removed. The result of this is shown in FIGS. 19A and 19B which are mutually orthogonal cross-sectional views (FIG. 19A being a cross-section aligned with the guiding direction of the waveguide). Finally, a wet or dry etch is used to remove around 200 nm of silicon dioxide from the facets of the device coupon. In this example, the silicon dioxide is removed from the end facets of the device i.e. those into which and from which light is coupled. The result of this is shown in FIG. 20.

Figure 21A:
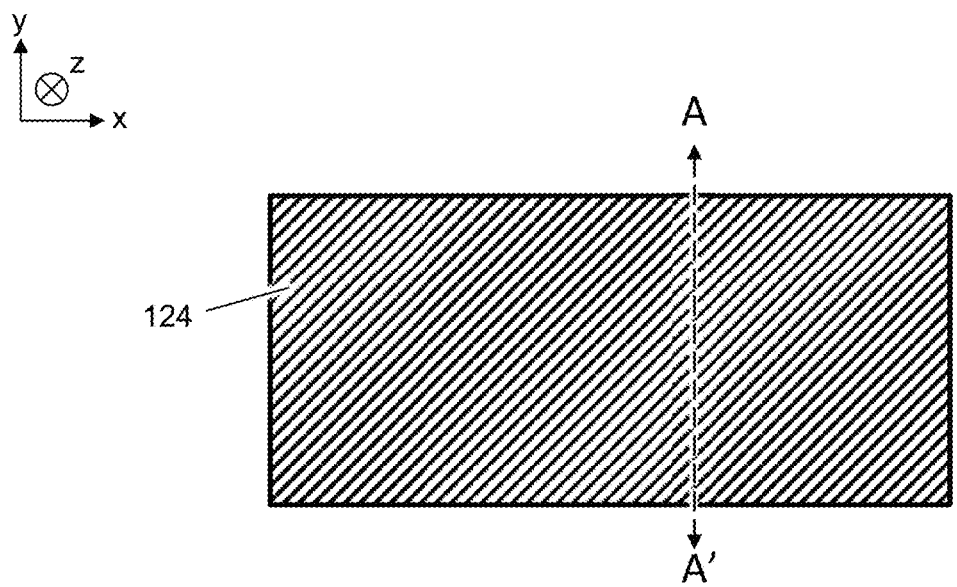
FIGS. 21A-23B show various steps of a variant method of fabricating device coupon.
Figure 21B:
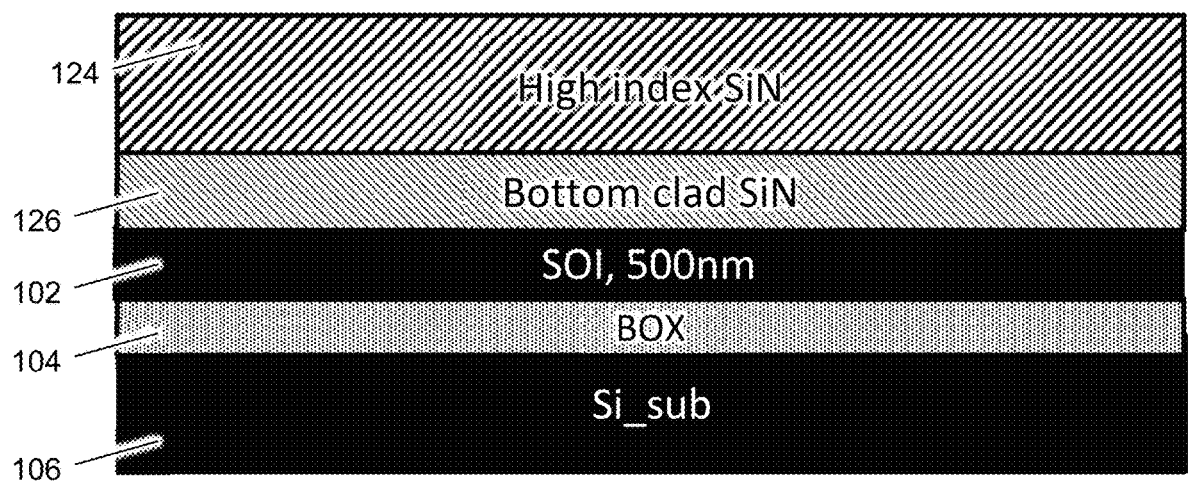
Figure 22A:
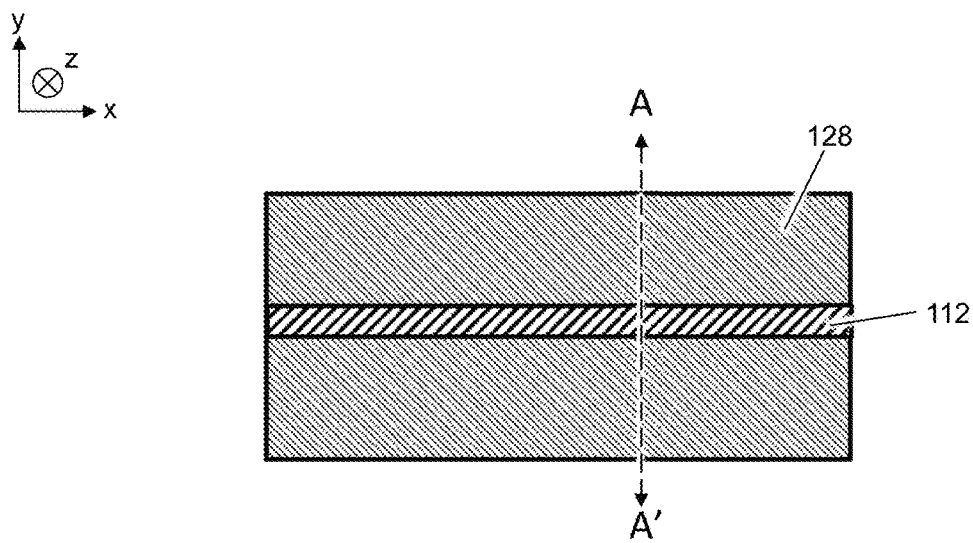
Figure 22B:
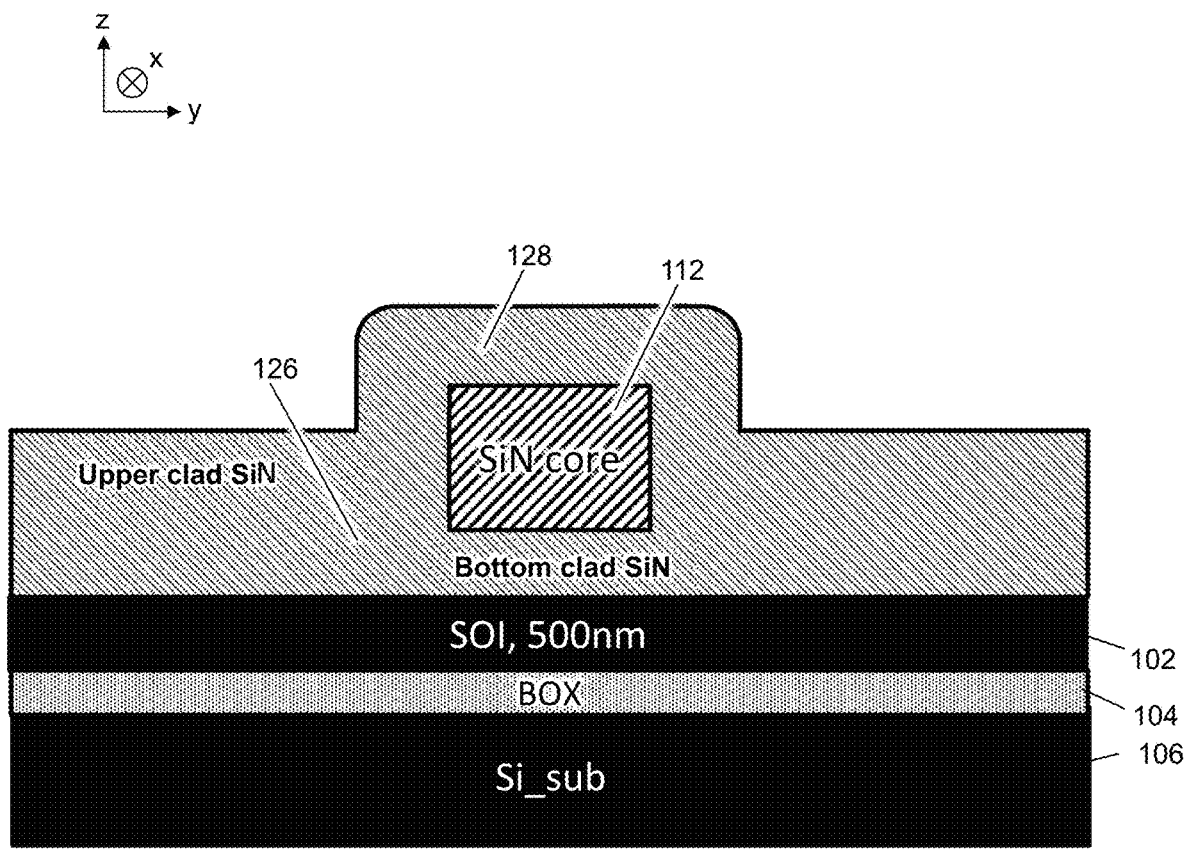
Figure 23A:
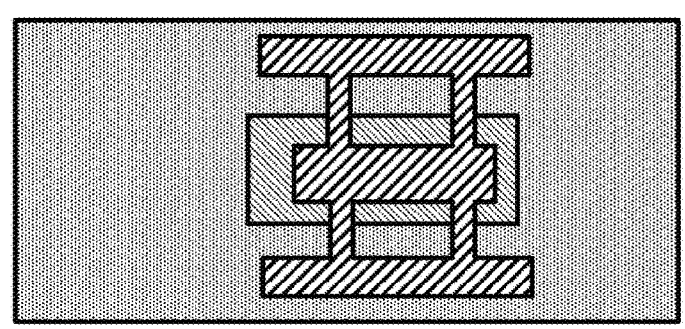
Figure 23B:
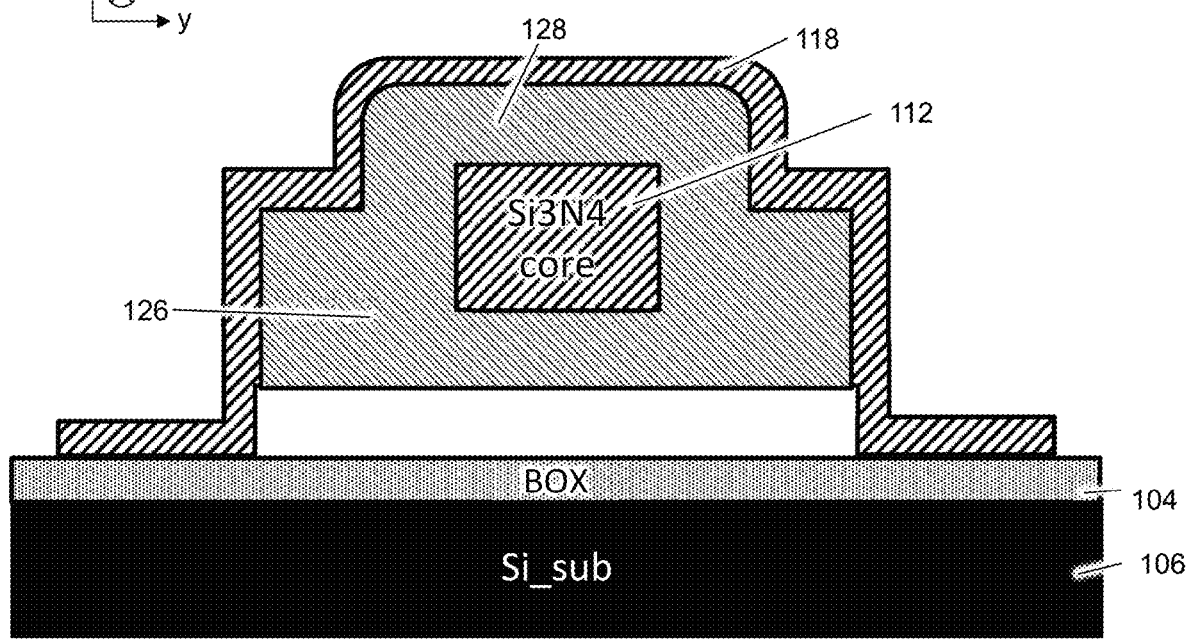

FIGS. 21A-23B show various steps of a variant method of fabricating device coupon. In contrast to the previous example, here the bottom cladding layer 126 is made of a low index silicon nitride composition as compared to the refractive index of the silicon nitride core 124. This is shown in FIGS. 21A and 21B. Next, further lower index silicon nitride is deposited to provide silicon nitride upper cladding layer 128. This is shown in FIGS. 22A and 22B. The remaining steps are identical to those discussed with respect to FIGS. 1A-16B, and the result is a variant device coupon as shown in FIGS. 23A and 23B.

Figure 24:
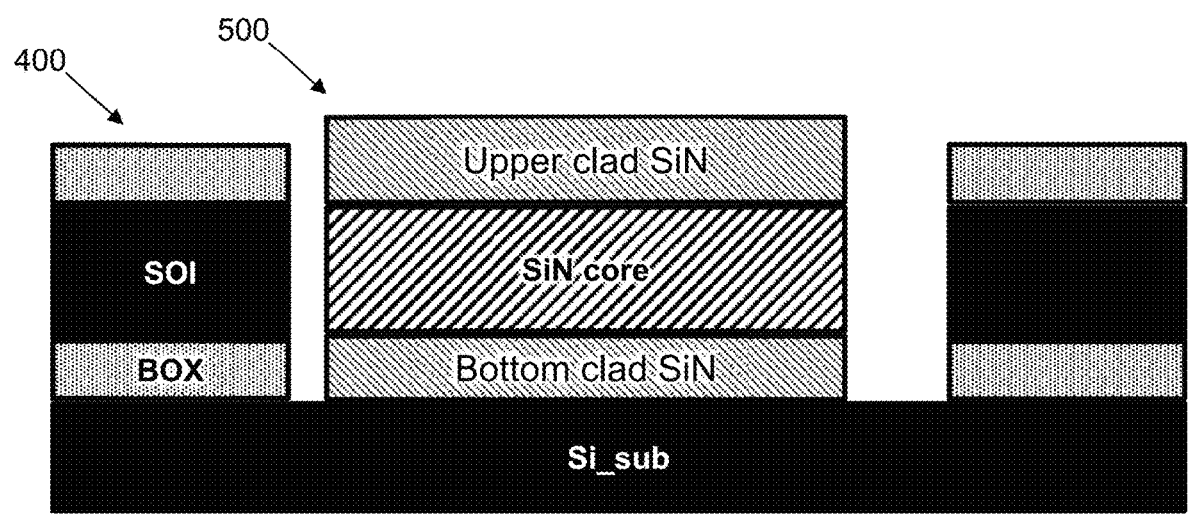
FIG. 24 shows an optoelectronic device fabricated using the variant device coupon of FIGS. 21A-23B.

FIG. 24 shows an optoelectronic device fabricated using the variant device coupon of FIGS. 21A-23B. It differs from the example shown in FIG. 20 in that the upper and lower cladding layers are formed of silicon nitride.

The features disclosed in the description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For the avoidance of any doubt, any theoretical explanations provided herein are provided for the purposes of improving the understanding of a reader. The inventors do not wish to be bound by any of these theoretical explanations.

Any section headings used herein are for organizational purposes only and are not to be construed as limiting the subject matter described.

Throughout this specification, including the claims which follow, unless the context requires otherwise, the word "comprise" and "include", and variations such as "comprises", "comprising", and "including" will be understood to imply the inclusion of a stated integer or step or group of integers or steps but not the exclusion of any other integer or step or group of integers or steps.

It must be noted that, as used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by the use of the antecedent "about," it will be understood that the particular value forms another embodiment. The term "about" in relation to a numerical value is optional and means for example +/−10%.

LIST OF FEATURES

102 Silicon on insulator layer
104 Buried oxide layer
106 Silicon substrate
108 Silicon nitride layer
110 $SiO_2$ bottom cladding layer
112 $Si_3N_4$ waveguide core
114 $SiO_2$ upper cladding layer
116 Photoresist
118 Silicon nitride tether layer
120 Photoresist
122 Stamp
124 High index silicon nitride layer
126 Silicon nitride bottom cladding layer
128 Silicon nitride upper cladding layer
200 Device coupon
300 Coupon wafer
400 Platform wafer
500 Device coupon

The invention claimed is:

1. A device coupon, suitable for use in a micro-transfer printing process, the device coupon comprising:
   a waveguide; and
   a tether,
   the waveguide being formed of:
      a lower cladding layer;
      an upper cladding layer; and
      a silicon nitride guiding layer, located between the lower cladding layer and the upper cladding layer.

2. A method of fabricating the device coupon of claim 1, the method comprising the steps, on a wafer, of:
   depositing the lower cladding layer on an uppermost surface of the wafer;

providing the silicon nitride guiding layer on an uppermost surface of the lower cladding layer;

depositing the upper cladding layer over at least an uppermost surface of the silicon nitride guiding layer; and providing the tether over the device coupon, and etching away a region of the uppermost layer of the wafer located between the lower cladding layer and a substrate of the wafer, thereby leaving the lower cladding layer, silicon nitride guiding layer, and upper cladding layer suspended above the wafer via the tether.

3. The method of claim 2, wherein providing the silicon nitride guiding layer includes the steps of:

bulk depositing silicon nitride over the uppermost surface of the lower cladding layer; and etching the deposited silicon nitride to define the silicon nitride guiding layer.

4. The method of claim 2, further including a step, between depositing the upper cladding layer and providing the tether, of etching one or more facets into the silicon nitride guiding layer.

5. The method of claim 4, wherein etching the one or more facets into the silicon nitride guiding layer includes depositing a photoresist over a portion of the upper surface of the upper cladding layer, and completely etching the exposed upper cladding layer and silicon nitride guiding layer.

6. The method of claim 4, wherein etching the one or more facets into the silicon nitride guiding layer includes partially etching the lower cladding layer.

7. The method of claim 6, wherein the remaining lower cladding layer, located adjacent to the one or more facets, has a thickness of up to 200 nm.

8. The method of claim 4, further including, after etching the one or more facets, a step of depositing a protective layer over the one or more facets.

9. The method of claim 8, wherein the protective layer is formed of silicon dioxide.

10. The method of claim 8, wherein the protective layer has a thickness of around 200 nm.

11. The method of claim 2, wherein the tether is formed from silicon nitride.

12. The method of claim 2, wherein providing the tether includes the steps of:

etching away an exposed uppermost layer of the wafer, leaving the region of the uppermost layer of the wafer located between the lower cladding layer and the substrate of the wafer;

bulk depositing the tether over the exposed upper surface of the device coupon and at least partially over the wafer;

patterning the tether with a mask; and etching the unmasked portions of the tether.

13. The method of claim 2, wherein etching away the uppermost layer of the wafer includes performing a wet etch.

14. The method of claim 13, wherein an etchant used in the wet etch is tetramethylammonium hydroxide.

15. The method of claim 2, wherein the wafer is a silicon-on-insulator wafer and the uppermost surface of the wafer is provided by a silicon device layer.

16. The method of claim 2, wherein the lower cladding layer and/or upper cladding layer are formed of silicon dioxide.

17. The device coupon of claim 1, wherein the tether couples the device coupon to a wafer, such that there is a gap between a lower surface of the lower cladding layer and an upper surface of an upper layer of the wafer.

18. A method of manufacturing an optoelectronic device, comprising the steps of:

providing a platform wafer, the platform wafer including a cavity; and micro-transfer printing the device coupon of claim 1 into the cavity.

19. The method of claim 18, further comprising a step of bonding the device coupon to a bed of the cavity.

20. The method of claim 18, further comprising a step of etching away one or more protective layers present over respective facets of the silicon nitride guiding layer.

21. The device coupon of claim 1, wherein the tether is a silicon nitride tether.

22. The device coupon of claim 1, wherein the lower cladding layer, the upper cladding layer, or both the lower cladding layer and the upper cladding layer comprise silicon dioxide or silicon nitride.

23. The device coupon of claim 1, wherein the tether couples the device coupon to a wafer.

24. The device coupon of claim 23, wherein the tether covers at least part of an upper surface of the waveguide and at least a part of the wafer that is adjacent to the waveguide.

25. The device coupon of claim 23, wherein the tether covers at least part of a sidewall of the waveguide and at least a part of the wafer that is adjacent to the waveguide.

26. The device coupon of claim 23, wherein the tether comprises:

a central support beam on the waveguide;

a first base pad on the wafer and adjacent to the waveguide; and a first arm extending from the central support beam to contact the first base pad.

27. The device coupon of claim 26, wherein the tether further comprises:

a second base pad on the wafer and adjacent to the waveguide at a different side of the waveguide than the first base pad is at; and a second arm extending from the central support beam to contact the second base pad.

28. The device coupon of claim 23, wherein the silicon nitride guiding layer has one or more facets exposed between the lower cladding layer and the upper cladding layer.

* * * * *